(12) United States Patent
Matsumoto et al.

(10) Patent No.: US 8,354,337 B2
(45) Date of Patent: Jan. 15, 2013

(54) METAL OXIDE FILM FORMATION METHOD AND APPARATUS

(75) Inventors: Kenji Matsumoto, Yamanashi (JP); Hidenori Miyoshi, Yamanashi (JP); Hitoshi Itoh, Yamanashi (JP); Hiroshi Sato, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 340 days.

(21) Appl. No.: 12/781,934

(22) Filed: May 18, 2010

(65) Prior Publication Data

US 2010/0323512 A1     Dec. 23, 2010

(30) Foreign Application Priority Data

Jun. 17, 2009  (JP) .................................. 2009-143967

(51) Int. Cl.
*H01L 21/44* (2006.01)
(52) U.S. Cl. .................. 438/608; 257/E21.295
(58) Field of Classification Search .................. 438/608
See application file for complete search history.

(56) References Cited

U.S. PATENT DOCUMENTS

| 2001/0002280 A1* | 5/2001 | Sneh ........................ 427/255.28 |
| 2009/0263578 A1* | 10/2009 | Lindfors et al. ........... 427/248.1 |
| 2010/0308463 A1* | 12/2010 | Yu et al. ........................ 257/753 |
| 2011/0049718 A1* | 3/2011 | Matsumoto et al. .......... 257/751 |

FOREIGN PATENT DOCUMENTS

JP     2008-300568 A     12/2008

* cited by examiner

*Primary Examiner* — Steven Loke
*Assistant Examiner* — Igwe U Anya
(74) *Attorney, Agent, or Firm* — Pearne & Gordon LLP

(57) ABSTRACT

[Problems]There is provided a metal oxide film forming method capable of controlling a film thickness of a metal oxide even if the metal oxide is subject to a self-limited thickness.
[Means for Solving the Problems]
A metal oxide film forming method includes a process (1) of supplying a metal source gas to a surface of a base before a temperature of the base reaches a film formation temperature of a metal oxide film; and a process (2) of setting the temperature of the base to be equal to or higher than the film formation temperature and forming the metal oxide film on the base by making a reaction between the metal source gas supplied to the surface of the base and residual moisture on the surface of the base.

23 Claims, 23 Drawing Sheets

COMPARATIVE EXAMPLE

METAL OXIDE FILM FORMATION METHOD AND APPARATUS

TECHNICAL FIELD

The present disclosure relates to a metal oxide film forming method and a metal oxide film forming apparatus.

BACKGROUND ART

A metal oxide, such as a manganese oxide, has been drawing attention as a material of diffusion barrier film (hereinafter, referred to as "barrier layer") for preventing diffusion of metal, such as copper (Cu), from an internal metal wiring of a semiconductor device. By way of example, in Patent Document 1, there is disclosed a semiconductor device in which a manganese oxide film formed by a thermal CVD method is used as a barrier layer of a copper wiring.

REFERENCES

Patent Document 1: Japanese Patent Laid-open Publication No. 2008-300568

DISCLOSURE OF THE INVENTION

Problems to be Solved by the Invention

In a manganese oxide film as a kind of a metal oxide film, there can be seen a so-called self-limit phenomenon in which after the manganese oxide film reaches a predetermined film thickness in a CVD process, it hardly grows further even if a manganese source gas is continuously supplied.

Accordingly, in a CVD process of a metal oxide film, it is difficult to obtain a film thickness as desired. Therefore, there has been a demand for a technology of controlling a thickness of a metal oxide film.

In view of the foregoing, the present disclosure provides a method and an apparatus of forming a metal oxide film of which a film thickness can be controlled.

Means for Solving the Problems

In order to solve the above-described problems, in accordance with a first aspect of the present disclosure, there is provided a metal oxide film forming method for forming a metal oxide film on a base. The metal oxide film forming method includes a process (1) of supplying a metal source gas to a surface of the base before a temperature of the base reaches a film formation temperature of the metal oxide film; and a process (2) of setting the temperature of the base to be equal to or higher than the film formation temperature and forming the metal oxide film on the base by making a reaction between the metal source gas supplied to the surface of the base and residual moisture containing moisture and/or a hydroxyl group on the surface of the base.

In accordance with a second aspect of the present disclosure, there is provided a metal oxide film forming method for forming a metal oxide film on a base. The metal oxide film forming method includes a process (3) of supplying a metal source gas to a surface of the base, condensing the metal source gas into a metal source, and making the metal source adsorbed onto the surface of the base when a temperature of the base is equal to or lower than a condensation temperature of the metal source gas; and a process (4) of setting the temperature of the base to be equal to or high than a film formation temperature of the metal oxide film and forming the metal oxide film on the base by making a reaction between the metal source adsorbed onto the surface of the base and residual moisture containing moisture and/or a hydroxyl group on the surface of the base.

In accordance with a third aspect of the present disclosure, there is provided a film forming apparatus for forming a metal oxide film on a base. The film forming apparatus includes a processing chamber that accommodates a target object having a base on which the metal oxide film is to be formed; a processing gas supply mechanism that supplies a gas to be used in a process into the processing chamber; a heating unit that heats the target object accommodated in the processing chamber; and a controller that controls the processing gas supply mechanism and the heating unit. Here, the controller may control the processing gas supply mechanism and the heating unit so as to perform the processes (1) and (2) of the metal oxide film forming method in accordance with the first aspect.

In accordance with a fourth aspect of the present disclosure, there is provided a film forming apparatus for forming a metal oxide film on a base. The film forming apparatus includes a processing chamber that accommodates a target object having a base on which the metal oxide film is to be formed; a processing gas supply mechanism that supplies a gas to be used in a process into the processing chamber; a heating unit that heats the target object accommodated in the processing chamber; and a controller that controls the processing gas supply mechanism and the heating unit. Here, the controller may control the processing gas supply mechanism and the heating unit so as to perform the processes (3) and (4) of the metal oxide film forming method in accordance with the second aspect.

In accordance with a fifth aspect of the present disclosure, there is provided a film forming apparatus for forming a metal oxide film on a base. The film forming apparatus includes first and second processing chambers that accommodate a target object having a base on which the metal oxide film is to be formed; a first processing gas supply mechanism that supplies a gas to be used in a process into the first processing chamber; a second processing gas supply mechanism that supplies a gas to be used in a process into the second processing chamber; a heating unit that heats the target object accommodated in the second processing chamber; and a controller that controls the first processing gas supply mechanism, the second processing gas supply mechanism, and the heating unit. Here, the controller may control the first processing gas supply mechanism so as to perform the process (3) of the metal oxide film forming method in accordance with the second aspect and controls the second processing gas supply mechanism and the heating unit so as to perform the process (4) of the metal oxide film forming method in accordance with the second aspect.

EFFECT OF THE INVENTION

In accordance with the present disclosure, it is possible to provide a method and an apparatus of forming a metal oxide film of which a film thickness can be controlled.

MODE FOR CARRYING OUT THE INVENTION

Figure 1:
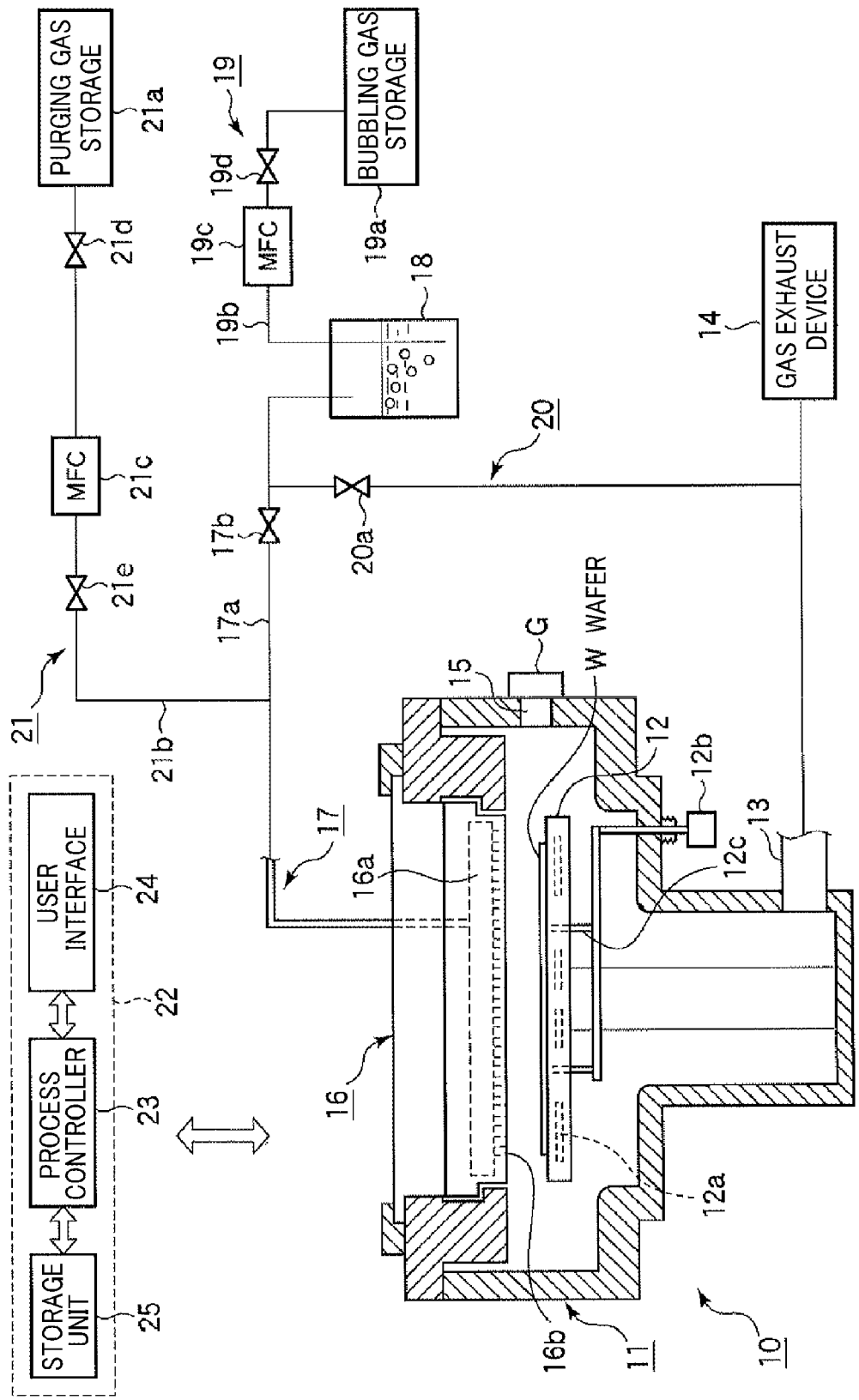
FIG. 1 is a cross-sectional view schematically showing an example of a film forming apparatus in which a metal oxide film forming method in accordance with a first embodiment of the present disclosure can be performed.

Hereinafter, embodiments of the present invention will be described with reference to the accompanying drawings. Further, same reference numerals will be assigned to same components through the whole drawings.

First Embodiment

Configuration of an Apparatus

FIG. 1 is a cross-sectional view schematically showing an example of a film forming apparatus in which a metal oxide film forming method in accordance with a first embodiment of the present disclosure can be performed. In the present example, as a film forming apparatus, there will be explained a thermal CVD apparatus which forms a metal oxide such as a manganese oxide on a target substrate such as a semiconductor wafer (hereinafter, referred to as "wafer"). However, the target substrate is not limited to a semiconductor wafer and the film forming apparatus is not limited to the thermal CVD apparatus.

As depicted in FIG. 1, a thermal CVD apparatus 10 includes a processing chamber (processing vessel) 11. Installed in the processing chamber 11 is a mounting table 12 that horizontally mounts a wafer W thereon. Embedded in the mounting table 12 is a heater 12a serving as a temperature control unit for the wafer W. Provided in the heater 12a is a non-illustrated temperature measuring unit (for example, a thermocouple) for controlling a temperature of the heater 12a. Further, provided in the mounting table are three lifter pins 12c (only two of which are illustrated for the simplicity of explanation) which can be vertically moved by an elevating mechanism 12b. The lifter pins 12c vertically move the wafer W, and the wafer W is transferred between a non-illustrated wafer transfer mechanism and the mounting table 12.

A bottom portion of the processing chamber 11 is connected to one end of a gas exhaust pipe 13, and the other end of the gas exhaust pipe 13 is connected to a gas exhaust device 14. Formed through a sidewall of the processing chamber 11 is a transfer port 15 which can be opened and closed by a gate valve G.

Installed at a ceiling portion of the processing chamber 11 is a gas shower head 16 facing the mounting table 12. The gas shower head 16 includes a gas room 16a, and a gas introduced into the gas room 16a is supplied into the processing chamber 11 through multiple gas discharge holes 16b. The gas shower head 16 is connected to a metal source gas supply line system 17 that introduces a metal source gas such as a gas containing a metal organic compound into the gas room 16a.

Mn source gas supply line system 17 includes a source gas supply line 17a, and an upstream side of the source gas supply line 17a is connected to a source storage 18. The source storage 18 stores a metal source such as a metal organic compound. In the present example, as a metal organic compound, a cyclopentadienyl-based metal organic compound, for example, (EtCp)$_2$Mn (bis(ethylcyclopentadienyl)manganese) containing manganese (Mn) as metal, is stored in a liquid phase. (EtCp)$_2$Mn is a manganese precursor. The source storage 18 is connected to a bubbling mechanism 19.

The bubbling mechanism 19 includes, for example, a bubbling gas storage 19a that stores a bubbling gas therein; a supply pipe 19b that supplies the bubbling gas to the source storage 18; and a mass flow controller (MFC) 19c and a valve 19d that control a flow rate of the bubbling gas flowing in the supply pipe 19b. The bubbling gas may be, for example, an argon (Ar) gas, a hydrogen (H$_2$) gas, and a nitrogen (N$_2$) gas. One end of the supply pipe 19b is dipped in a metal source liquid, e.g., (EtCp)$_2$Mn in the present example, stored in the source storage 18. By jetting the bubbling gas from the supply pipe 19b, the metal source liquid becomes bubbled and vaporized. The vaporized metal source gas, e.g., vaporized (EtCp)$_2$Mn in the present example, is supplied into the gas room 16a of the gas shower head 16 via the source gas supply line 17a and the valve 17b that opens and closes the source gas supply line 17a.

Further, a preflow line 20 connected to the gas exhaust device 14 is connected between the valve 17b and the source storage 18. A valve 20a is provided on the preflow line 20. Until a bubbling flow rate of the metal source gas becomes stable, the valve 17b is closed and the valve 20a is opened so as to flow a metal source gas through the preflow line 20. On the contrary, when the bubbling flow rate becomes stable and a metal source gas needs to be supplied, the valve 20a is closed and the valve 17b is opened so as to flow the metal source gas through the source gas supply line 17a.

Furthermore, a purge mechanism 21 is connected between the valve 17b and the gas room 16a of the gas shower head 16. The purge mechanism 21 includes, for example, a purging gas storage 21a that stores a purging gas therein; a supply pipe 21b that supplies the purging gas to the source gas supply line 17a; and a mass flow controller (MFC) 21c and valves 21d and 21e that control a flow rate of the purging gas flowing in the supply pipe 21b. The valve 21d is positioned between the purging gas storage 21a and the mass flow controller 21c, and the valve 21e is positioned between the source gas supply line 17a and the mass flow controller 21c. The purging gas may be, for example, an argon (Ar) gas, a hydrogen (H$_2$) gas, and a nitrogen (N$_2$) gas. In order to purge the inside of the source gas supply line 17a, the inside of the gas room 16a, and the inside of the processing chamber 11, the valve 17a is closed and the valves 21d and 21e are opened and then the purging gas is flown through the source gas supply line 17a and the supply pipe 21b. The purging gas can be also used as a bubbling gas of the metal source gas. That is, the bubbling gas storage 19a and the purging gas storage 21a can be combined. Moreover, hereinafter, all of the purging gas, the bubbling gas, and a pressure controlling gas to be described later will be referred to as "carrier gas."

The processing chamber 11, the gas exhaust pipe 13, the gate valve G, the gas shower head 16, the metal source gas supply line system 17 (including 17a and 17b), the source storage 18, the preflow line 20 (including 20a), the supply pipe 21b, and the valve 21e are controlled to be a predetermined temperature ranging from about room temperature to about 150° C. in order to prevent the metal source gas from being condensed. In the present example, as described below, since (EtCp)$_2$Mn used as a metal source can be condensed at a temperature in a range from about 50° C. to about 70° C., the above-mentioned components are set to be a temperature of about 80° C.

Further, in order to control a pressure, a pressure gauge is installed in the processing chamber 11 and a pressure control valve is installed in the gas exhaust pipe 13. However, illustration thereof is omitted.

A controller 22 controls the thermal CVD apparatus 10. The controller 22 includes a process controller 23, a user interface 24, and a storage unit 25. The user interface 24 includes a keyboard through which an operation manager inputs commands to manage the thermal CVD apparatus 10, a display which visualizes and displays an operation status of the thermal CVD apparatus 10, or the like. The storage unit 25 stores therein a control program for performing a process of the thermal CVD apparatus 10 under the control of the controller 23 or a recipe including operation condition data. If necessary, the recipe is retrieved from the storage unit 25 in response to the commands from the user interface 24 and executed by the controller 23, so that the thermal CVD apparatus 10 can be controlled. The recipe can be stored in a computer-readable storage medium such as a CD-ROM, a hard disk, a flash memory or the like, or the recipe can be frequently transmitted from another apparatus via, for example, a dedicated line.

In the present example, processes according to a metal oxide film forming method to be described below are performed in sequence under the control of the controller 23.

(Metal Oxide Film Forming Method)

Hereinafter, there will be explained an example of a metal oxide film forming method in accordance with the first embodiment of the present disclosure.

In the present example, there will be illustrated an example in which a metal oxide film, such as a manganese oxide film, is formed on a TEOS film formed on the wafer W (for example, a silicon wafer).

Figure 2:
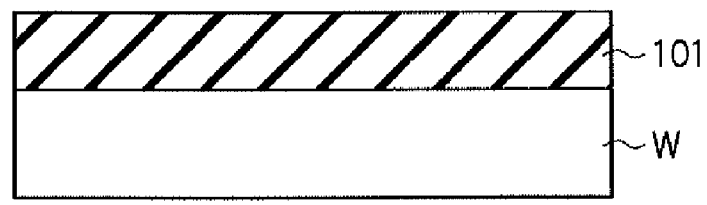
FIG. 2 shows an example of a cross section of a sample.

FIG. 2 shows an example of a cross section of a sample.

As depicted in FIG. 2, a sample has a TEOS film 101 formed on the wafer W. A manganese oxide film is formed on the TEOS film 101 serving as a base. In the present example, the following process is performed.

Figure 3:
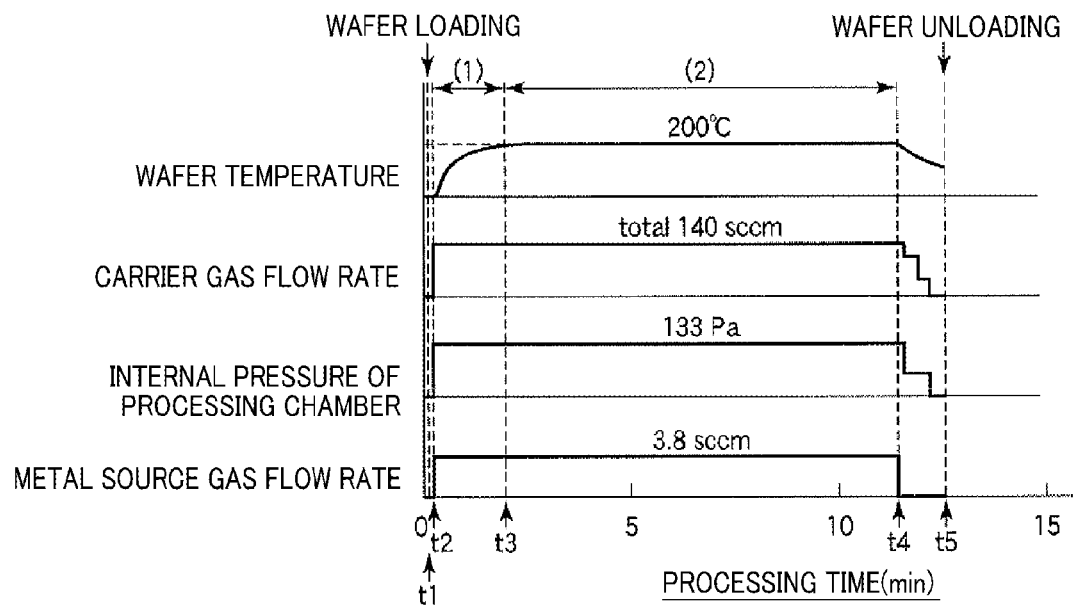
FIG. 3 is a timing chart showing a control example of the metal oxide film forming method in accordance with the first embodiment of the present disclosure.

FIG. 3 is a timing chart showing a control example of a wafer temperature, a flow rate of a carrier gas, an internal pressure of a processing chamber, and a flow rate of a metal source gas.

As depicted in FIG. 3, the present example includes a process (1) of supplying a metal source gas, such as an (EtCp)$_2$Mn gas which is a manganese precursor, onto a surface of the TEOS film 101 before a temperature of the wafer W reaches a film formation temperature of a manganese oxide film and a process (2) of setting the temperature of the wafer W to be equal to or higher than the film formation temperature of a manganese oxide film and forming a manganese oxide film on the TEOS film 101 by allowing a reaction between the (EtCp)$_2$Mn gas supplied onto the surface of the TEOS film 101 and residual moisture on the surface of the TEOS film 101.

The film formation temperature can be chosen in a range from a temperature equal to or higher than a condensation temperature of a metal source gas to a temperature less than a decomposition temperature of the metal source gas. By way of example, if the metal source gas is (EtCp)$_2$Mn gas, the film formation temperature can be chosen in a range from a condensation temperature of the (EtCp)$_2$Mn gas, i.e., about 70° C. to a thermal decomposition temperature of the (EtCp)$_2$Mn gas, i.e., about 400° C.

To be specific, the wafer W on which the TEOS film 101 is formed is loaded into the processing chamber 11 and then is mounted on the mounting table 12 (time t1). Subsequently, a temperature of the wafer W is increased up to a film formation temperature of about 200° C. by the heater 12a, in the present example. Actually, if a setting temperature of the heater 12a is constantly maintained and the wafer W having about room temperature is mounted on the mounting table 12, the temperature of the wafer W is increased by heat conduction from the mounting table 12 to the wafer W as time passes. In the first embodiment, during an increase of the wafer temperature, a metal source gas such as an (EtCp)$_2$Mn gas in the present example is supplied into the processing chamber 11 together with a carrier gas such as an argon (Ar) gas in the present example (time t2). Further, an internal pressure of the processing chamber 11 is increased to about 133 Pa in the present example in order to improve an efficiency of heat transfer of the wafer W when an increase of the temperature and supply of the metal source gas are started. If the temperature of the wafer W reaches the film formation temperature (time t3), the film formation temperature is maintained constant for a predetermined film formation time. If the film formation time is elapsed (time t4), heating of the wafer W and the supply of the metal source gas are stopped and a flow rate and a pressure of the carrier gas are reduced step by step in the present example. If the internal pressure of the processing chamber 11 is reduced to a pressure at which the wafer W can be unloaded, the wafer W is moved out of the mounting table 12 and unloaded from the processing chamber 11 to the outside (time t5).

In other film formation experiments in which a film formation time varies from about 6 seconds to about 60 minutes, a thickness of a manganese oxide film is slightly increased, but the film thickness is not much distinguishably different between when the film formation time is about 6 seconds and when the film formation time is about 60 minutes. In the present example, although a film formation time (a time for the process (2)) is set to about 10 minutes, the film formation time may be set to be about 10 seconds or less based on a result of the above-described experiment. Further, in order to reduce costs of the metal source or to improve throughput and to prevent inner walls of the processing chamber from being contaminated, it is possible and desirable to reduce the film formation time.

(Film Forming Mechanism)

Figure 4:
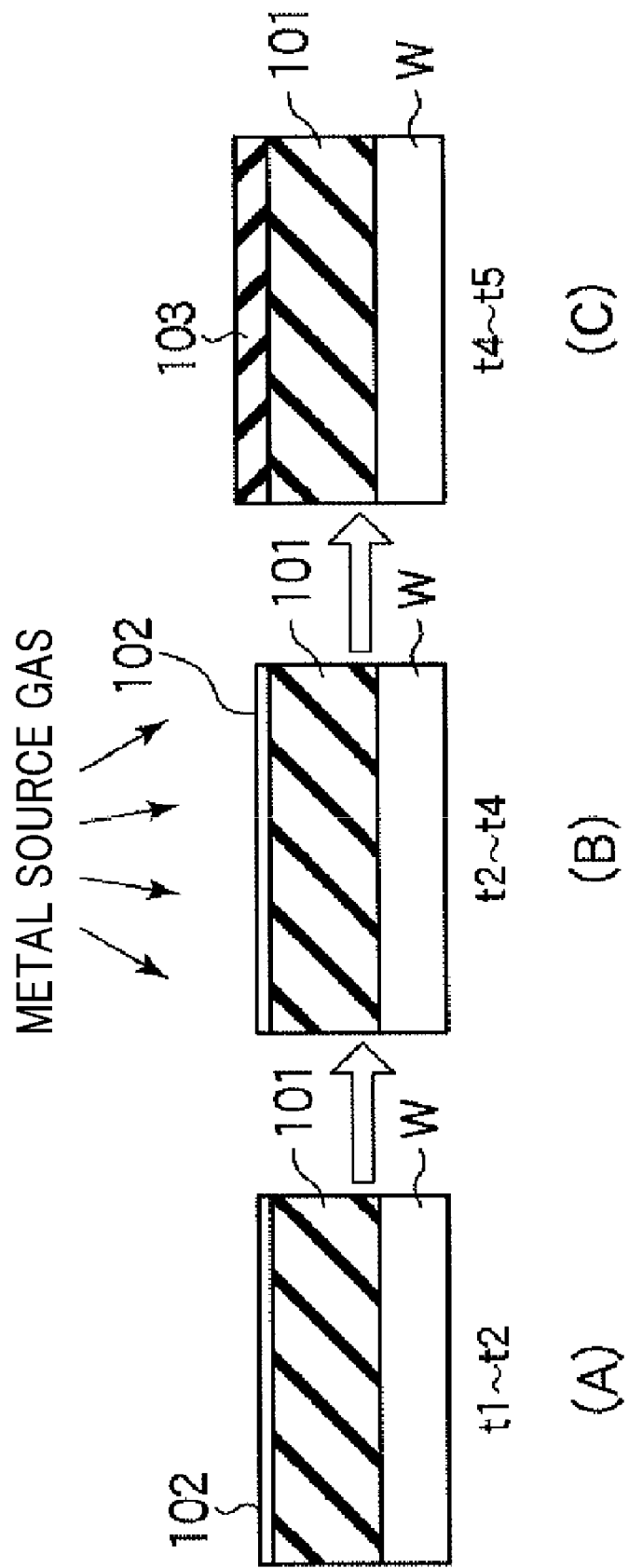
FIGS. 4A to 4C are cross-sectional views showing a film forming mechanism in the metal oxide film forming method in accordance with the first embodiment of the present disclosure.

A film forming mechanism in the metal oxide film forming method in accordance with the first embodiment is illustrated in FIGS. 4A to 4C.

FIG. 4(A) shows a status of the wafer W right after the wafer W is loaded.

As depicted in FIG. 4(A), right after the wafer W is loaded, there remain moisture and/or a hydroxyl group (—OH) on a surface of the TEOS film 101. Hereinafter, the moisture and/or the hydroxyl group (—OH) remaining on the film surface will be referred to as "residual moisture" (residual moisture 102). Further, residual moisture containing the moisture and/or the hydroxyl group (—OH) may also be referred to as "physical adsorption moisture" and/or "chemical adsorption moisture."

In the first embodiment, as depicted in FIG. 4(B), a metal source gas such as an (EtCp)$_2$Mn gas is supplied onto the surface of the TEOS film 101 even before a temperature of the wafer W reaches a film formation temperature. Therefore, the residual moisture 102 on the surface of the TEOS film 101 comes into contact with the metal source gas and reacts with each other before the temperature of the wafer W reaches the film formation temperature. While the residual moisture 102 is reacting with the metal source gas, the temperature of the wafer W is adjusted to the film formation temperature. Subsequently, as depicted in FIG. 4(C), a metal oxide film, e.g., a manganese oxide film 103 in the present example, is formed on the TEOS film 101.

It is deemed that a reaction formula for film formation of the manganese oxide film 103 may be as follows.

(Reaction with Moisture)

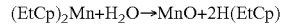
(EtCp)$_2$Mn+H$_2$O→MnO+2H(EtCp)

(Reaction with a Hydroxyl Group)

(EtCp)$_2$Mn+OH→MnO+H(EtCp)+(EtCp)

Comparative Example

Figure 5:
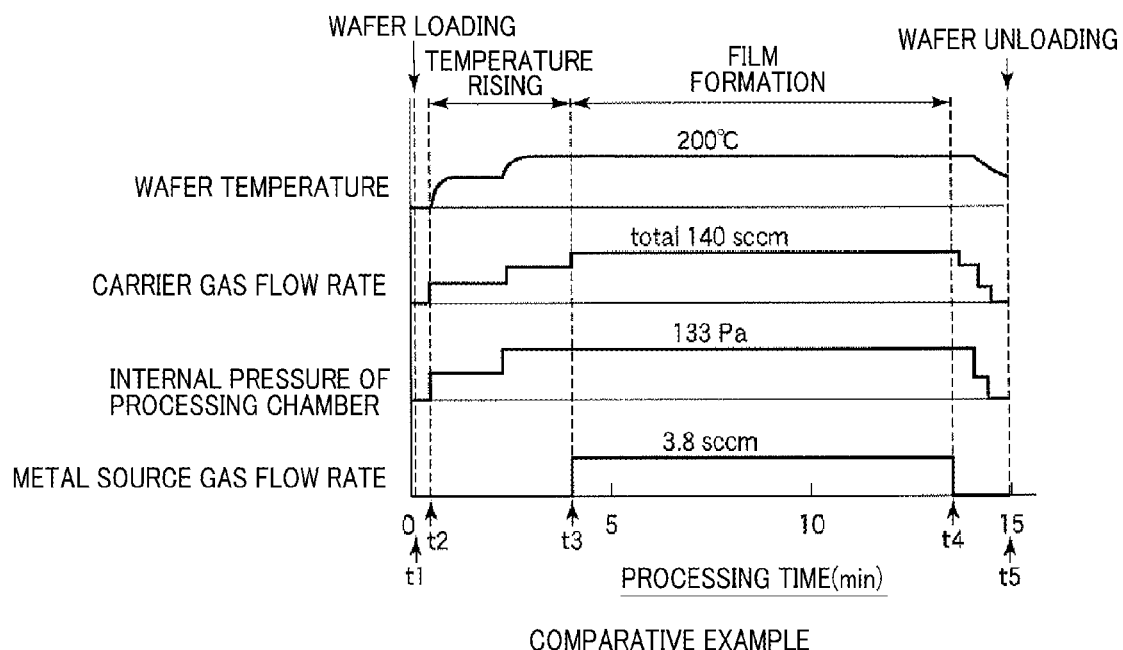
FIG. 5 is a timing chart showing a control example of a metal oxide film forming method in accordance with a comparative example.

For reference, there is illustrated a timing chart showing a control example of a metal oxide film forming method in accordance with a comparative example in FIG. 5, and a film forming mechanism in FIGS. 6A to 6D.

A metal oxide film forming method in accordance with the comparative example is different from the metal oxide film forming method in accordance with the first embodiment in that a metal source gas is supplied into the processing chamber 11 after the temperature of a wafer W reaches a film formation temperature of, for example, about 200° C.

Figure 6:
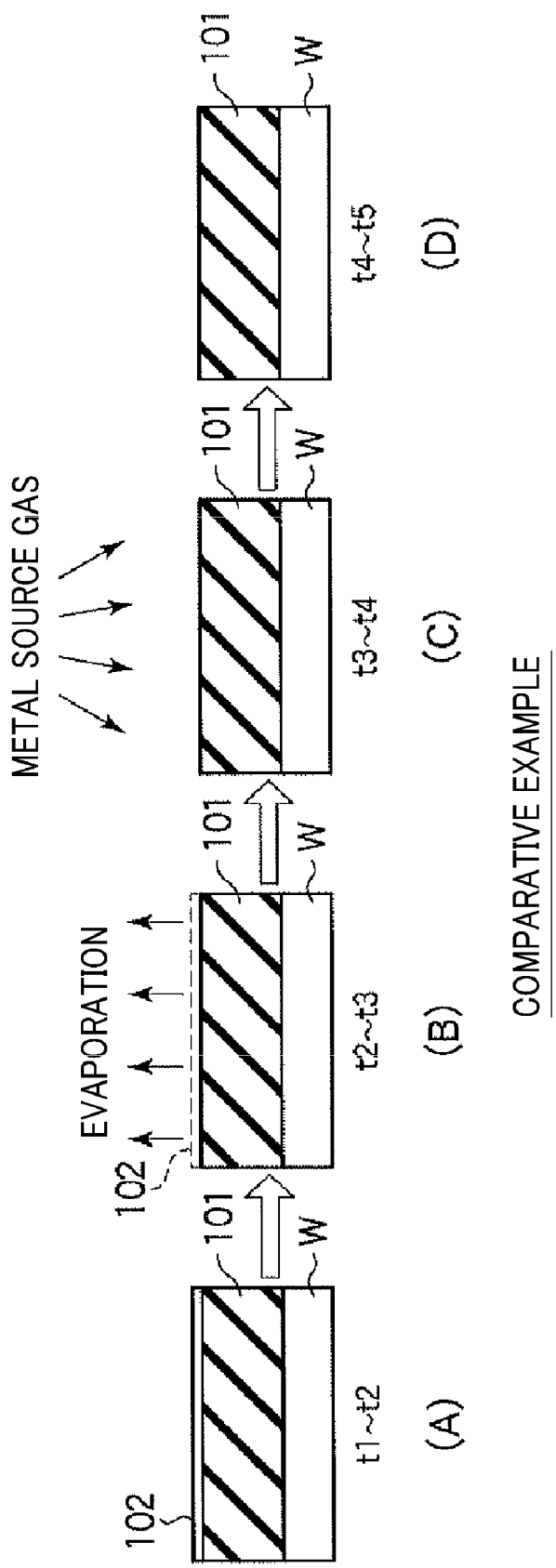
FIGS. 6A to 6D are cross-sectional views showing a film forming mechanism in the metal oxide film forming method in accordance with the comparative example.

In the manganese oxide film forming method in accordance with the comparative example, as depicted in FIG. 6(A), there remains moisture (residual moisture 102) on the surface of the TEOS film 101 right after the wafer W is loaded. However, during a process of increasing a temperature, the temperature of the wafer W is increased up to, for example, about 200° C. Therefore, as depicted in FIG. 6(B), the residual moisture 102 is evaporated from the surface of the TEOS film 101. Subsequently, as depicted in FIG. 6(C), in a state that there exists very little residual moisture 102 on the surface of the TEOS film 101, a metal source gas such as an (EtCp)$_2$Mn gas is supplied onto the surface of the TEOS film 101.

In the comparative example, the metal source gas hardly reacts with the residual moisture 102. Further, as depicted in FIG. 6(D), a metal oxide film such as a manganese oxide film in the present example is not formed on the TEOS film 101, or only a thin manganese oxide film subject to a self-limit can be formed in the present example. In the comparative example, it is impossible to control a thickness of the metal oxide film.

On the contrary, in the metal oxide film forming method in accordance with the first embodiment, the residual moisture 102 on the surface of the TEOS film 101 reacts with the metal source gas even before the temperature of the wafer W reaches the film formation temperature, and, thus, it is possible to control a thickness of the metal oxide film. To be specific, the control process is performed as follows.

(Control of a Thickness of a Metal Oxide Film)

First, a thickness of a metal oxide film can be controlled based on an amount of residual moisture 102 on a surface of a base when supply of a metal source gas is started.

The amount of residual moisture 102 can be controlled based on a temperature of a base when supply of a metal source gas is started.

Further, a temperature of the base can be controlled, for example, by the following first to fourth temperature control examples.

First Control Example of a Base Temperature

Figure 7:
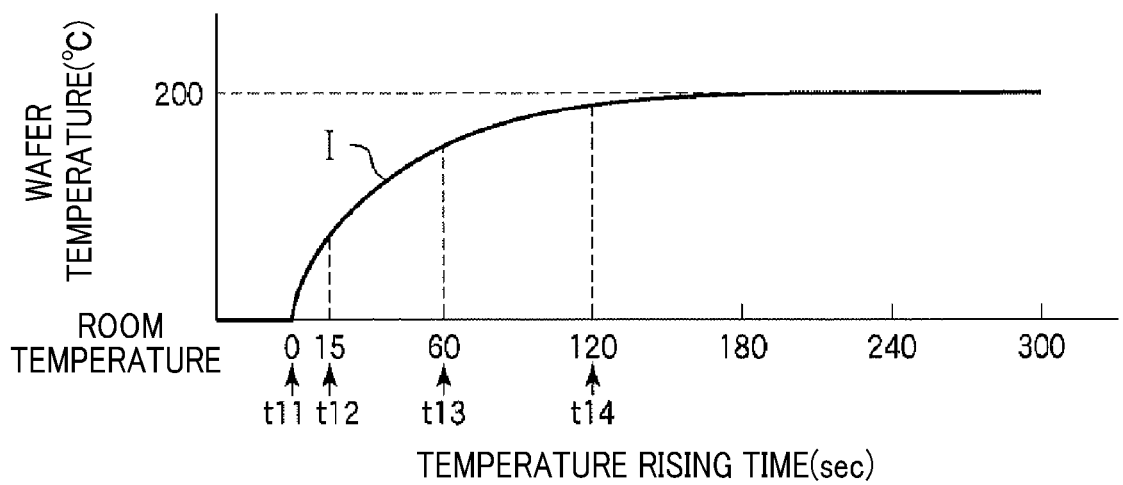
FIG. 7 is a timing chart showing a first control example of a base temperature.

FIG. 7 is a timing chart showing a first control example of a base temperature.

A curve I of FIG. 7 is a temperature rising curve of the wafer W when an internal pressure of the processing chamber 11 is set to be about 133 Pa (=1 Torr) and a temperature of the wafer W is increased to about 200° C.

As shown in FIG. 7, before the temperature of the wafer W is increased, the wafer W has, for example, room temperature. The temperature of the wafer W is increased from the room temperature to a film formation temperature such as 200° C., as shown in the temperature rising curve I. As the temperature of the wafer W is increased, the temperature of the base, e.g., the TEOS film 101 in the present example, is also increased. The residual moisture 102 on the surface of the TEOS film 101 is vaporized and reduced as the temperature of the TEOS film 101 is increased. In this way, the amount of the residual moisture 102 can be varied depending on a temperature rising time of the wafer W.

By way of example, if supply of the metal source gas is started at the same time (time t11) when an increase of the temperature is started, the metal source gas, e.g., the $(EtCp)_2Mn$ gas in the present example, comes into contact with more residual moisture. Consequently, it is possible to form a thick metal oxide film, e.g., a thick manganese oxide film in the present example. On the contrary, if the supply of the metal source gas is delayed from the time when the increase of the temperature is started to the time t12, t13, or t13, the residual moisture 102 is reduced, so that a thin manganese oxide film is formed.

Figure 8:
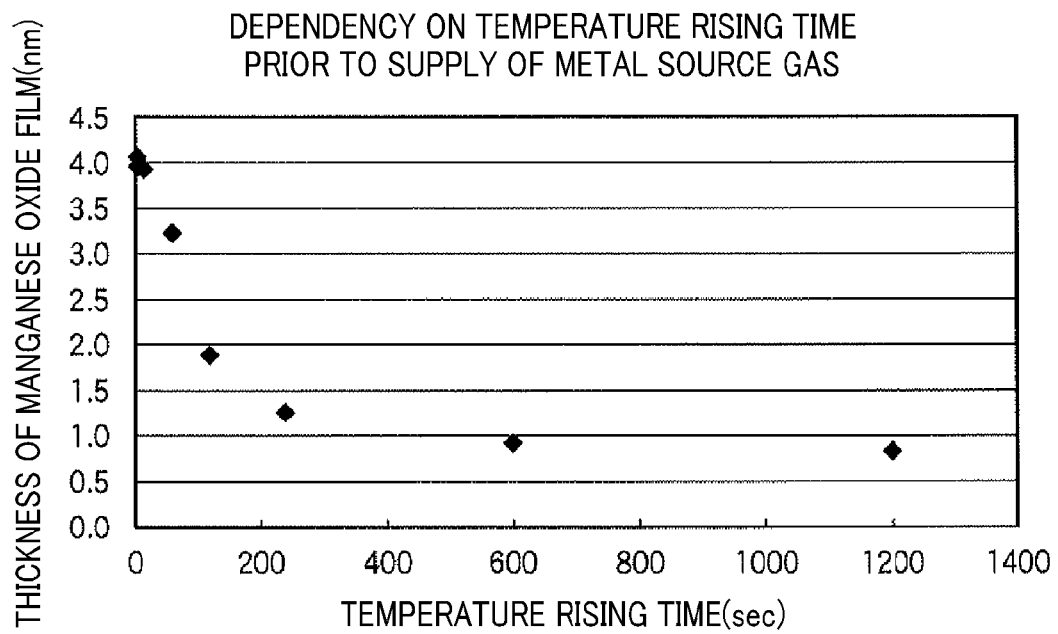
FIG. 8 shows dependency of a thickness of a metal oxide film on a temperature rising time prior to supply of a metal source gas.

FIG. 8 shows dependency of a thickness of a metal oxide film on a temperature rising time prior to supply of a metal source gas.

As depicted in FIG. 8, as a temperature rising time prior to supply of a metal source gas is increased, a thickness of a manganese oxide film becomes thinner from about 4.0 nm, and if the temperature rising time exceeds about 300 seconds, the manganese oxide film has an almost uniform film thickness of about 0.8 nm (self-limited film thickness) regardless of the temperature rising time.

The thickness of the manganese oxide film has been measured by a transmission electron microscope (TEM) and an X-ray fluorescence spectrometer (XRF).

As described above, the temperature of the base can be controlled based on a heating time of the base until the metal source gas is supplied. Further, by controlling the heating time of the base until the metal source gas is supplied, the amount of the residual moisture on the surface of the base can be controlled, and, thus, the thickness of the metal oxide film can be controlled.

Second Control Example of a Base Temperature

Figure 9:
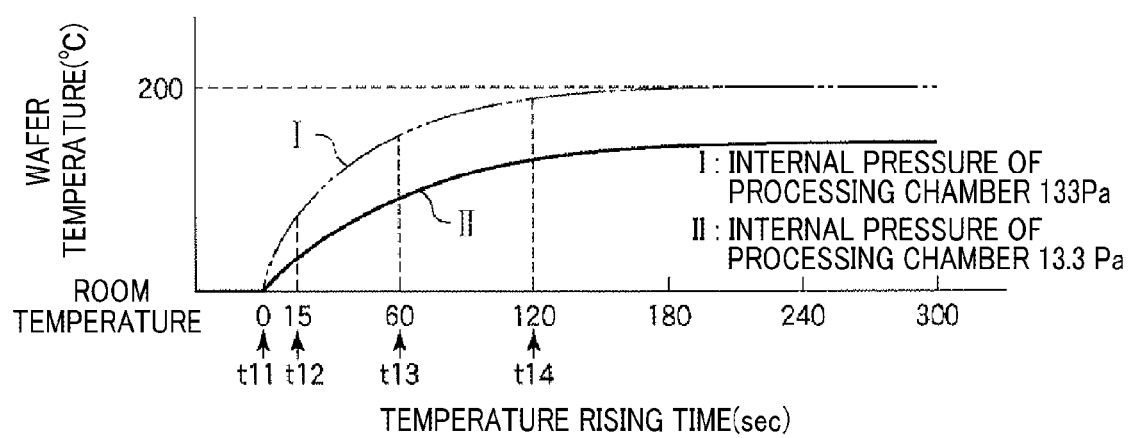
FIG. 9 is a timing chart showing a second control example of a base temperature.

FIG. 9 is a timing chart showing a second control example of a base temperature.

As depicted in FIG. 9, a difference between a second control example of a base temperature and the first control example of the base temperature is an internal pressure of the processing chamber 11. In the first control example of the base temperature, the internal pressure of the processing chamber 11 is set to be about 133 Pa (=1 Torr), whereas in the second control example of the base temperature, the internal pressure of the processing chamber 11 is set to be about 13.3 Pa (=0.1 Torr).

That is, in the second control example of the base temperature, by changing ambient pressure of the base, e.g., the internal pressure of the processing chamber 11 in the present example, heat conductivity to the base, e.g., the TEOS film 101 in the present example, is changed and the temperature of the wafer W is controlled.

If the internal pressure of the processing chamber 11 is changed, there is a change in heat conductivity from a heating unit such as the heater 12a to the base such as the TEOS film 101 formed on the wafer W. To be specific, if the pressure becomes higher, the heat conductivity becomes increased, and if the pressure becomes lower, the heat conductivity becomes decreased. By using this phenomenon, a temperature rising rate of the wafer W can be controlled. In the present control example, as can be seen a temperature rising curve II, by setting the internal pressure of the processing chamber 11 to be about 13.3 Pa, the temperature rising rate of the wafer W becomes decreased as compared to the control example in which the internal pressure of the processing chamber 11 is set to be about 133 Pa. If the temperature rising rate of the wafer W is decreased, it is possible to prevent a sharp change in the temperature of the wafer W, so that an amount of residual moisture can be controlled with high accuracy.

As described above, the temperature of the base can be controlled based on the ambient pressure of the base until the metal source gas is supplied. Accordingly, as in the first control example of the base temperature, the amount of the residual moisture on the surface of the base can be controlled, and, thus, the thickness of the metal oxide film can be controlled.

However, since a final temperature of the wafer is varied depending on an internal pressure of the processing chamber (for example, a temperature of the wafer can be increased to about 200° C. at a pressure of about 133 Pa, but at a pressure of about 13.3 Pa, a temperature of the wafer may be increased up to about 190° C.), it is needed to appropriately correct a setting temperature of the heater 12a.

Third Control Example of a Base Temperature

Further, a temperature of a base can be controlled based on a distance between the base and a heating unit which heats the base.

Figure 10A:
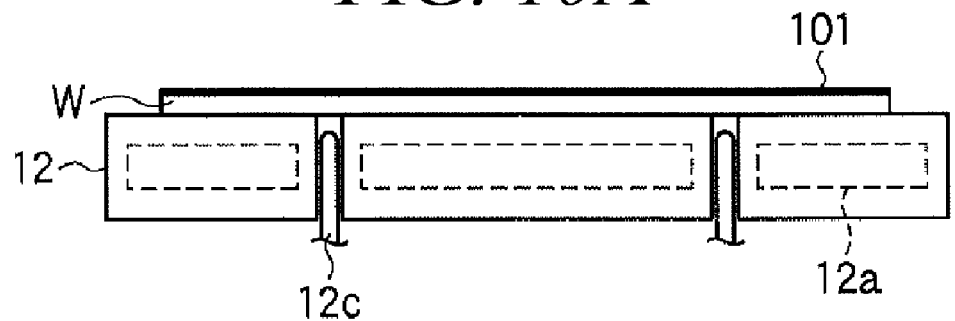
FIG. 10A is a cross-sectional view showing a third control example of a base temperature.
Figure 10B:
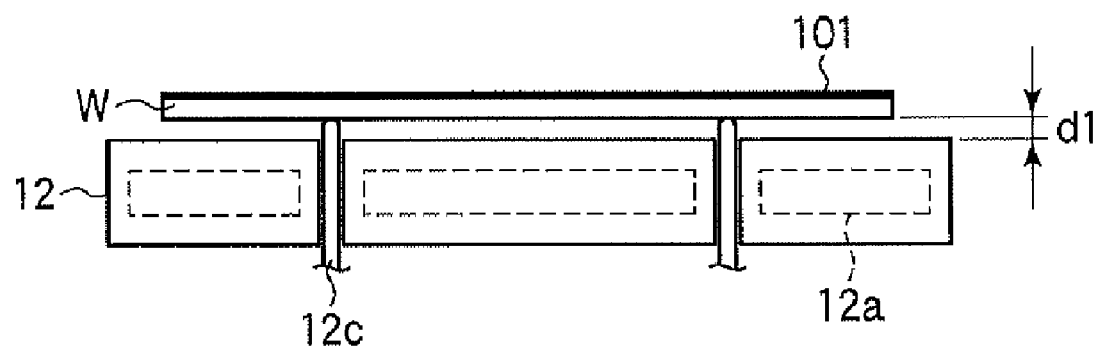
FIG. 10B is another cross-sectional view showing the third control example of the base temperature.
Figure 10C:
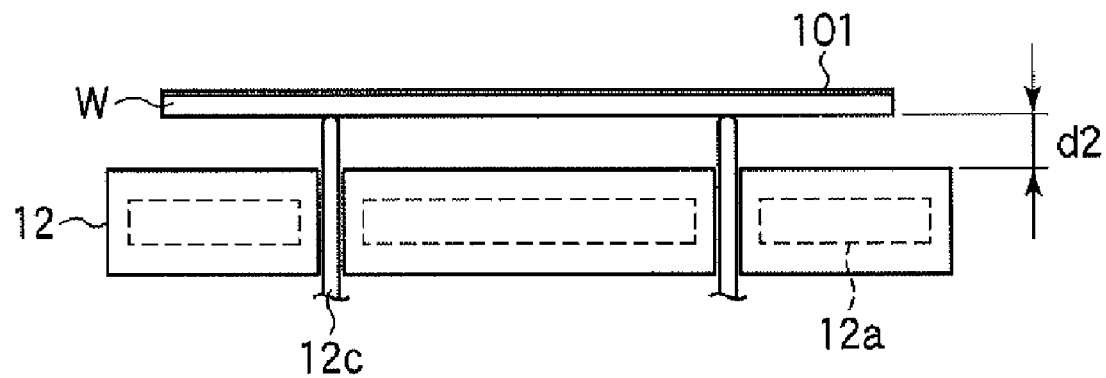
FIG. 10C is still another cross-sectional view showing the third control example of the base temperature.

FIGS. 10A to 10C are cross-sectional views showing a third control example of a base temperature.

FIG. 10A shows a status where the wafer W is in contact with the mounting table 12 in which a heating unit such as the heater 12a is embedded. FIG. 10B shows a status where the wafer W is positioned slightly away from the mounting table 12 at a distance d1 by raising the lifter pins 12c. FIG. 10C shows a status where the wafer W is positioned away from the mounting table 12 at a distance d2 farther than the distance d1 by further raising the lifter pins 12c.

Figure 11:
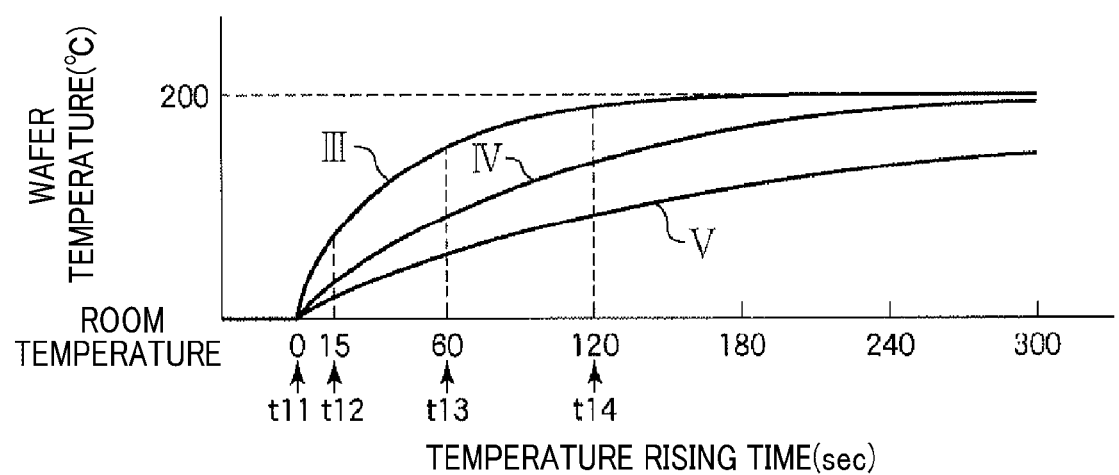
FIG. 11 shows a relationship between a distance of a wafer from a mounting table and a temperature rising rate of the wafer.

FIG. 11 shows a relationship between a distance of the wafer W from the mounting table 12 and a temperature rising rate of the wafer W.

In FIG. 11, temperature rising curves III, IV, and V represent the statuses shown in FIGS. 10A, 10B, and 10C, respectively. As shown in the temperature rising curves III to V, the temperature rising rate of the wafer W can be reduced as the distance between the wafer W and the mounting table 12 is increased.

In this way, by changing the distance between the wafer W and the mounting table 12, the temperature of the wafer W, i.e., the temperature of the TEOS 101 serving as a base can be controlled.

However, since a final temperature of the wafer is varied depending on a distance between the wafer W and the mounting table 12 (for example, a temperature of the wafer can be increased to about 200° C. in FIG. 10A, but in FIG. 10B, a temperature of the wafer may be increased up to about 190° C.), it is needed to appropriately correct a setting temperature of the heater 12a.

Fourth Control Example of a Base Temperature

Furthermore, a temperature of a base can be controlled by changing a kind of gas around the base. Table 1 shows a relationship between a kind of gas and heat conductivity at a temperature of about 100° C.

TABLE 1

| Kind of gas | Heat conductivity ($\times 10^{-2}$ W·m$^{-1}$·K$^{-1}$) at a temperature of about 100° C. |
|---|---|
| $H_2$ | 21.18 |
| He | 17.77 |
| $N_2$ | 3.09 |
| Ar | 2.12 |
| CO | 3.04 |
| $CO_2$ | 2.23 |
| Xe | 0.70 |

As shown in Table 1, heat conductivity varies depending on a kind of gas. By way of example, at a temperature of about 100° C., a $H_2$ gas and a He gas have high heat conductivity but a $N_2$ gas and an Ar gas have low heat conductivity. Therefore, if a kind of a gas around the base, i.e., a kind of a gas introduced into the processing chamber, is changed with reference to heat conductivity varying depending on a kind of gas, it is possible to control the temperature of the base, for example, the temperature of the wafer W or the temperature rising rate of the wafer W.

By way of example, the $H_2$ gas and the He gas have heat conductivity higher than that of the $N_2$ gas and the Ar gas. Accordingly, in order to increase the temperature rising rate of the wafer W, the $H_2$ gas and the He gas may be introduced into the processing chamber, whereas in order to reduce the temperature rising rate of the wafer W, the $N_2$ gas and the Ar gas may be introduced into the processing chamber. In this way, by changing a kind of the gas around the base, the temperature of the base can be controlled.

Further, as for a kind of gas, for example, four kinds of gases shown in Table 1 may be used individually, or at least two of four kinds of gases may be mixed to be used.

Furthermore, if a mixture ratio of gases is changed, the gases may have different heat conductivity from the heat conductivity shown in Table 1. If the heat conductivity of the gas around the base is changed by mixing the gases, the temperature of the wafer W or the temperature rising rate of the wafer W may have a wider range.

In the present embodiment, there have been described only four examples as a control example of a base temperature. In addition to these examples, it may be possible to change the temperature rising rate of the wafer W by varying a power supply to the heater 12a or to control the temperature of the base by changing surface roughness of the mounting table 12.

OTHER CONTROL EXAMPLES OF RESIDUAL MOISTURE

Other Control Example 1

The amount of the residual moisture on the base can be controlled based on a thickness of the base in addition to the above-described control method of controlling the amount of the residual moisture based on the temperature of the base when the supply of the metal source gas is started.

The base such as the TEOS film 101 absorbs moisture therein. If the temperature of the wafer W, i.e., the temperature of the TEOS film 101 is increased, the moisture absorbed into the TEOS film 101 comes out to the surface thereof. An absolute amount of the moisture absorbed into the TEOS film 101 depends on a thickness of the TEOS film 101.

Particularly, although not illustrated, an absolute amount of moisture absorbed into a thick TEOS film 101 is greater than an absolute amount of moisture absorbed into a thin TEOS film 101. Therefore, by way of example, when the temperature of the wafer W is increased, the thick TEOS film 101 has a greater amount of moisture coming out to the surface of the TEOS film 101. By setting a thickness of the TEOS film 101 in consideration of an amount of moisture coming out to its surface, it is possible to control an amount of moisture.

In this way, the amount of the residual moisture on the base can be controlled based on the thickness of the base, i.e., the thickness of the TEOS film 101 in the present control example.

Other Control Example 2

The amount of the residual moisture on the base can be controlled based on an exposed area of the base as well as the thickness of the base.

When a metal oxide film is formed, a metal source gas is in contact with an exposed surface of a base, such as the TEOS film 101. The amount of the residual moisture on the base can be controlled based on a size of the exposed area of the exposed surface. If the exposed area is large, an amount of contact between the metal source gas and the residual moisture becomes increased, whereas if the exposed area is small, an amount of contact between the metal source gas and the residual moisture becomes decreased.

By way of example, in order to control the amount of the residual moisture based on a size of the exposed area, it is possible to consider a pattern density formed on the TEOS film 101 although it is not illustrated. For example, if the TEOS film 101 serves as an interlayer insulating film, the amount of the residual moisture can be controlled in consideration of grooves or holes, or density of grooves and holes formed in this interlayer insulating film. By way of example, if the grooves are densely formed, the exposed area of the TEOS 101 becomes increased as compared with a case where the grooves are sparsely formed. Further, if the holes are densely formed, a size of the exposed area of the TEOS film 101 is determined depending on which is larger between an area of the hole's side surface and an exposed area of a film other than the TEOS film, i.e., an exposed area of a wiring or an electrode conductor which is exposed to a bottom of the hole. It is also possible to determine a size of the exposed area of the TEOS film 101 based on both the density of the grooves and the density of the holes. The grooves and the holes formed in the TEOS film 101 may be, for example, wiring grooves, electrode grooves, via holes and contact holes.

As described above, the amount of the residual moisture of the base can be controlled based on the exposed area of the base, i.e., the exposed area of the TEOS film 101 in the present example.

Other Control Example 3

The amount of the residual moisture on the base can be controlled based on an amount of moisture existing around the base.

When a metal oxide film is formed, a base such as the TEOS film 101 formed on the wafer W is accommodated in the processing chamber 11. The amount of the residual moisture on the surface of the TEOS film 101 can be varied depending on an amount of moisture within the processing chamber 11, i.e., a partial pressure of moisture within the processing chamber 11. If the amount of the moisture in the processing chamber 11 is large, the amount of the residual moisture on the surface of the TEOS film 101 is increased (or a decrease in the amount of the residual moisture lessens), whereas if the amount of the moisture in the processing chamber 11 is small, the amount of the residual moisture on the surface of the TEOS film 101 is decreased (or a decrease in the amount of the residual moisture rises).

In an example of controlling the amount of the residual moisture depending on the amount of the moisture in the processing chamber 11, although not illustrated, a mass spectrometer capable of measuring the amount of the moisture in the processing chamber 11 may be provided in the processing chamber 11. The mass spectrometer may be, for example, a quadruple mass spectrometer (hereinafter, referred to as "QMASS"). Instead of using the mass spectrometer, it may be possible to use, for example, a tunable semiconductor laser absorption spectroscopy.

By way of example, in accordance with a control using the amount of the moisture existing around the base, the amount of the moisture in the processing chamber 11 can be analyzed by, for example, the QMASS; the analyzed amount of the moisture can be fed back to the controller 22; and an amount of contact between the metal source gas and the residual moisture can be controlled to be a predetermined amount by adjusting a temperature rising time or the like.

As described above, the amount of the residual moisture on the base can be controlled based on the amount of the moisture existing around the base.

Other Control Example 4

The amount of the residual moisture on the base can be controlled by supplying moisture from the outside. By way of example, in order to control an amount of moisture existing around the base, e.g., an amount of moisture in the processing chamber 11, a water bubbling supply system is installed in or connected with the processing chamber 11 and small quantity of water may be supplied into the processing chamber 11 while an amount of water is controlled.

In addition to the control of the amount of the moisture in the processing chamber 11 by supplying the moisture to the base from the outside, for example, it is also possible to control the amount of the residual moisture on the base by making a gas containing water and/or a hydroxyl group (—OH) contact with the base in advance. To be specific, the wafer W on which the base such as the TEOS film 101 is formed is loaded into the processing chamber in a saturated steam atmosphere for a short time and is unloaded therefrom. Further, the wafer W can be passed through under the gas shower which discharges a gas containing steam and/or a hydroxyl group (—OH) so as to make the base, such as the TEOS film 101, contact with the gas.

Second Embodiment

Metal Oxide Film Forming Method

Figure 12:
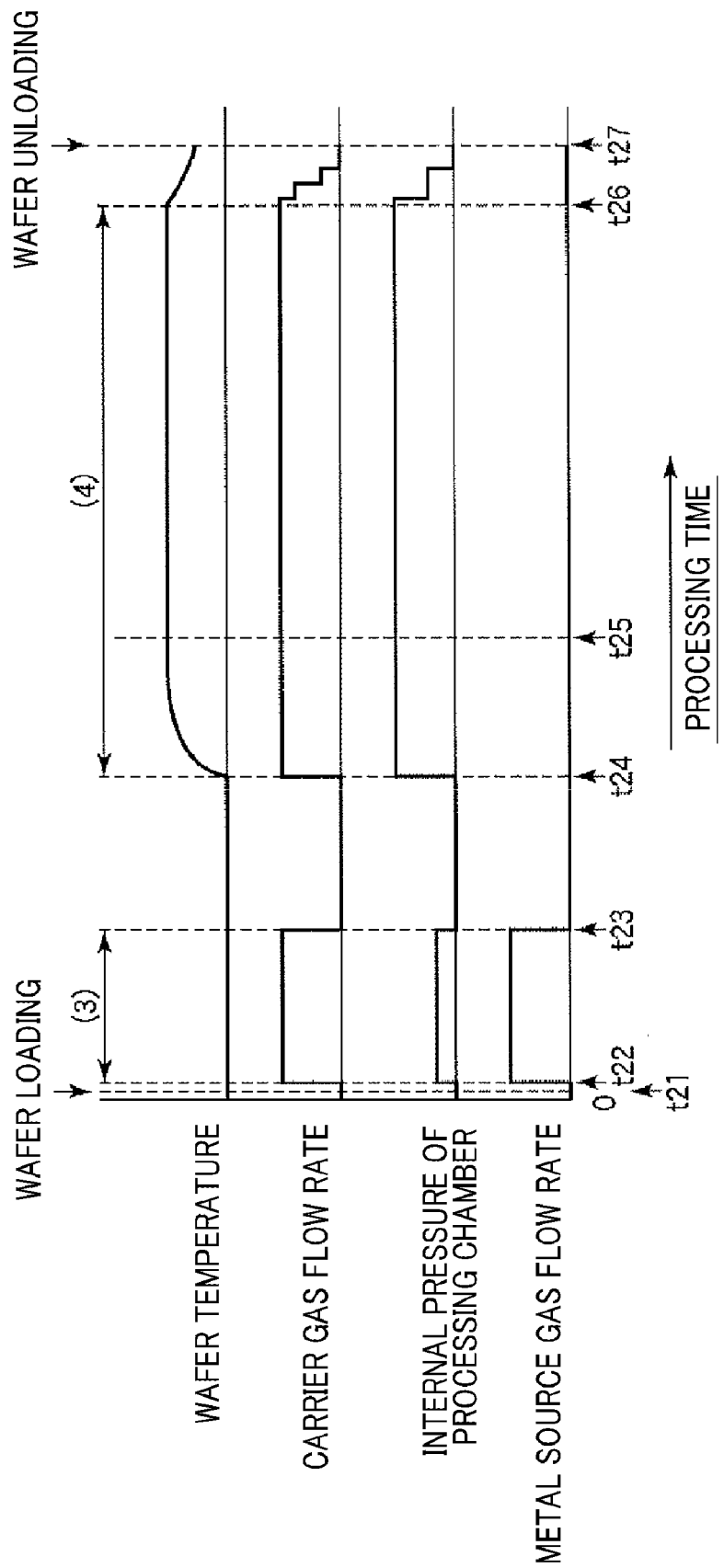
FIG. 12 is a timing chart showing a control example of a metal oxide film forming method in accordance with a second embodiment of the present disclosure.

FIG. 12 is a timing chart showing a control example of a wafer temperature, a flow rate of a carrier gas, an internal pressure of a processing chamber 11, and a flow rate of a metal source gas in accordance with a metal oxide film forming method of a second embodiment. Further, a sample to be used in the present example is the same as the sample of FIG. 2.

As depicted in FIG. 12, the second embodiment includes a process (3) of supplying a metal source gas such as an (EtCp)$_2$Mn gas onto the wafer W's surface, e.g., a TEOS film 101 in the present example when a temperature of a base, e.g., a wafer W in the present example, is equal to or lower than a condensation temperature of the (EtCp)$_2$Mn gas; condensing the (EtCp)$_2$Mn gas and making the condensed (EtCp)$_2$Mn adsorbed onto a surface of the TEOS film 101. Further, the second embodiment includes a process (4) of setting a temperature of the wafer W to be a film formation temperature of a manganese oxide film and forming the manganese oxide film on the TEOS film 101 by making a reaction between the (EtCp)$_2$Mn adsorbed onto the surface of the TEOS film 101 and residual moisture on the surface of the TEOS film 101.

As described above, the second embodiment is particularly different from the first embodiment in that the metal source, e.g., the (EtCp)$_2$Mn in the present example, is adsorbed onto the surface of the TEOS film 101. That is, after the metal source is adsorbed onto the surface of the TEOS film 101, the adsorbed metal source and the residual moisture on the base, e.g., the surface of the TEOS film 101 in the present example, are reacted with each other so as to form a metal oxide film such as the manganese oxide film in the present example. The metal source is adsorbed when a temperature of the base, e.g., the wafer W in the present example, is equal to or lower than the condensation temperature of the metal source gas, e.g., the (EtCp)$_2$Mn gas in the present example. The metal oxide film is formed when the temperature of the base, e.g., the wafer W in the present example, is equal to or higher than the film formation temperature of the metal oxide film, e.g., the manganese oxide film in the present example.

The above-described metal oxide film forming method can be carried out by the thermal CVD apparatus 10 illustrated in FIG. 1.

By way of example, in case of using the thermal CVD apparatus 10 illustrated in FIG. 1, the wafer W on which the TEOS film 101 is formed is loaded into the processing chamber 11 and mounted on the mounting table 12 (time t21). Then, in the present example, without increasing the temperature of the wafer W, the metal source gas, e.g., the (EtCp)$_2$Mn gas in the present example, is supplied into the processing chamber 11 together with a carrier gas, such as an argon (Ar) gas in the present example. Further, an internal pressure of the processing chamber 11 is started to be increased to about 40 Pa at the same time when the supply of the metal source gas is started (time t22) in the present example. If the temperature of the wafer W is not increased, it is not necessary to increase the internal pressure of the processing chamber 11, but in order to improve supply uniformity of the metal source gas, it may be possible to maintain the internal pressure of the processing chamber 11 at a predetermined level. The supply of the metal source gas and the carrier gas is continued for a predetermined time period. If the predetermined time passes (time t23), the supply of the metal source gas and the carrier gas is stopped. Further, the pressure is reduced in the present example. In this way, the metal source adsorption process is ended.

Thereafter, the temperature of the wafer W is increased up to a film formation temperature, i.e., about 200° C. in the present example, by the heater 12a (time t24). Further, the carrier gas such as the argon (Ar) gas in the present example, is supplied into the processing chamber 11 as a pressure control gas. Furthermore, the internal pressure of the processing chamber 11 is started to be increased to about 133 Pa at the same time when the supply of the pressure control gas is started in the present example. If the temperature of the wafer W reaches the film formation temperature (time t25), the film formation temperature is maintained constant for a predetermined film formation time. If the film formation time is elapsed (time t26), heating of the wafer W, and a flow rate and a pressure of the pressure control gas are reduced step by step in the present example. If the internal pressure of the processing chamber 11 is reduced to a pressure at which the wafer W can be unloaded, the wafer W is moved out of the mounting table and unloaded from the processing chamber 11 to the outside (time t27). In this way, the metal oxide film forming process is ended.

Third Embodiment

Figure 13:
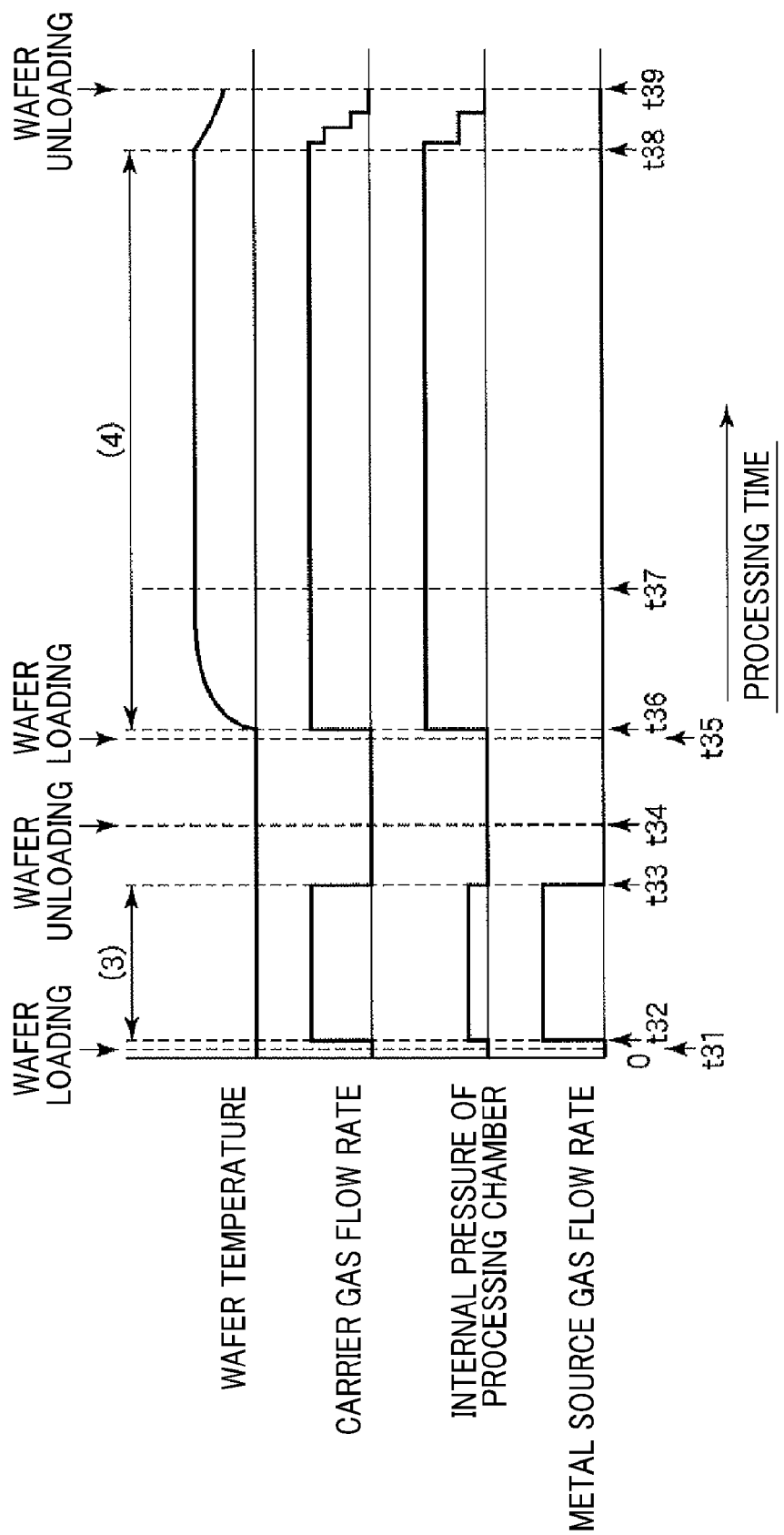
FIG. 13 is a timing chart showing a control example of a metal oxide film forming method in accordance with a third embodiment of the present disclosure.

FIG. 13 is a timing chart showing a control example of a wafer temperature, a flow rate of a carrier gas, an internal pressure of a processing chamber 11, and a flow rate of a metal source gas in accordance with a metal oxide film forming method of a third embodiment. Further, a sample to be used in the present example is the same as the sample of FIG. 2.

As depicted in FIG. 13, the third embodiment is different from the second embodiment in that the metal source adsorption process (3) and the metal oxide film forming process (4) are performed in separate processing chambers. Further, both processes are consecutively performed without exposing a base to the atmosphere.

In this metal oxide film forming method, a semiconductor manufacturing apparatus of a cluster tool type (multi chamber type) can be used, for example.

Figure 14:
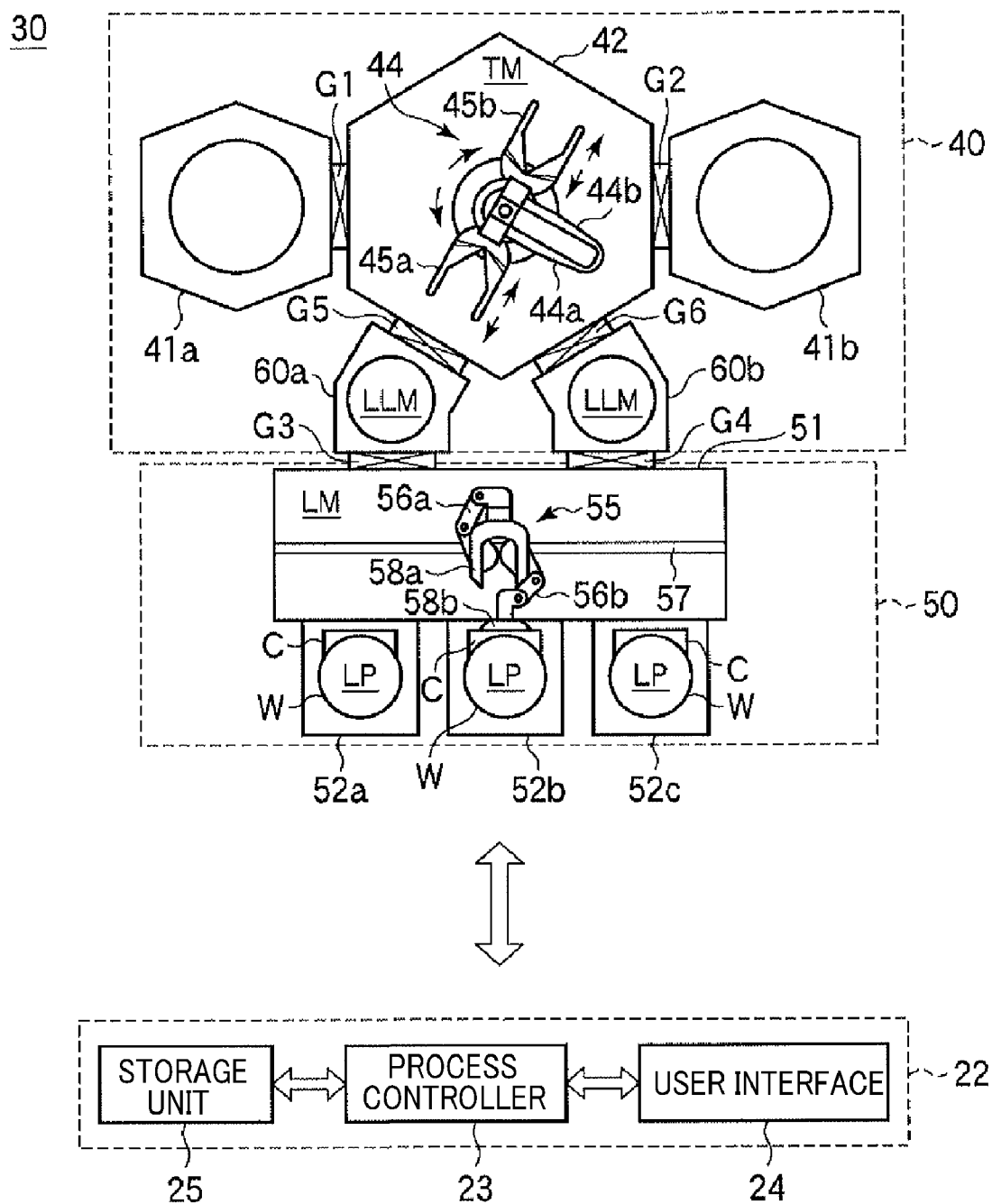
FIG. 14 is a plane view schematically illustrating an example of a film forming system in which the metal oxide film forming method in accordance with the third embodiment of the present disclosure can be performed.

FIG. 14 is a plane view schematically illustrating an example of a film forming system in which the metal oxide film forming method in accordance with the third embodiment of the present disclosure can be performed. In this embodiment, there will be illustrated an example of a film forming system capable of performing a film forming process on a semiconductor wafer (hereinafter, referred to as "wafer") as a substrate in manufacturing a semiconductor device.

As depicted in FIG. 14, a film forming system 30 includes a processing unit 40 which performs a process on a wafer W, a loading/unloading unit 50 which loads and unloads the wafer W into/from the processing unit 40, and a controller 22 which controls the film forming system 30.

In the present example, the processing unit 40 includes two processing chambers (processing chambers 41a and 41b) in which a process is performed on the wafer W. Each of the processing chambers 41a and 41b is configured to be depressurized to a predetermined vacuum level. In the processing chamber 41a, as a process prior to a film forming process on the wafer W, a metal source is adsorbed onto the wafer W, and in the processing chamber 41b, as a film forming process on the wafer W, a metal oxide film is formed on the wafer W. The processing chambers 41a and 41b are connected to a single transfer chamber (TM) 42 via gate valves G1 and G2, respectively.

The loading/unloading unit 50 includes a loading/unloading chamber (LM) 51. The loading/unloading chamber 51 is configured to be capable of controlling an internal pressure thereof to be an atmospheric pressure or a substantially atmospheric pressure, such as a slightly positive pressure with respect to an atmospheric pressure of the outside. In the present example, the loading/unloading chamber 51 has a shape of a rectangle including long sides and short sides orthogonal to the long sides when viewed from the top. The long side of the rectangle is adjacent to the processing unit 40. The loading/unloading chamber 51 includes load ports LP each equipped with a carrier C in which the wafer W is accommodated. In the present example, three load ports 52a, 52b, and 52c are installed at the loading/unloading chamber 51's long side opposite to the processing unit 40. Although the three load ports are illustrated in the present example, the number of the load ports is not limited and can be arbitrarily set. At each of the load ports 52a to 52c, a non-illustrated shutter is installed. If a carrier C accommodating the wafer W therein or an empty carrier C is installed at the load ports 52a to 52c, the non-illustrated shutter is moved to prevent introduction of an external atmosphere and the inside of the carrier C communicates with the inside of the loading/unloading chamber 51.

Installed between the processing unit 40 and the loading/unloading unit 50 are load lock chambers (LLM), such as two load lock chambers 60a and 60b in the present example. Each of the load lock chambers 60a and 60b is configured to be capable of changing an internal pressure thereof into a vacuum pressure, an atmospheric pressure or a substantially atmospheric pressure. The load lock chambers 60a and 60b are connected to the loading/unloading chamber 51's one side opposite to the load ports 52a to 52c via gate valves G3 and G4, respectively, and also connected to the transfer chamber 42's two sides other than two sides connected to the processing chambers 41a and 41b via gate valves G5 and G6. The load lock chambers 60a and 60b communicate with the loading/unloading chamber 51 by opening a corresponding gate valve G3 or G4 and are isolated from the loading/unloading chamber 51 by closing a corresponding gate valve G3 or G4. Further, the load lock chambers 60a and 60b communicate with the transfer chamber 42 by opening a corresponding gate valve G5 or G6 and are isolated from the transfer chamber 42 by closing a corresponding gate valve G5 or G6.

Installed within the loading/unloading chamber 51 is a loading/unloading mechanism 55. The loading/unloading mechanism 55 loads and unloads the wafer W into/from the carriers C and loads and unloads the wafer W into/from the load lock chambers 60a and 60b. The loading/unloading mechanism 55 includes, for example, two multi-joint arms 56a and 56b and is configured to move on a rail 57 extended in a longitudinal direction of the loading/unloading chamber 51. Provided at front ends of the multi-joint arms 56a and 56b are hands 58a and 58b, respectively. The wafer W is mounted on the hand 58a or 58b, and is loaded and unloaded as described above.

The transfer chamber 42 is configured as, for example, a vacuum chamber, capable of maintaining a vacuum therein. Installed in this transfer chamber 42 is a transfer mechanism 44 which transfers the wafer W between the processing chambers 41a and 41b and the load lock chambers 60a and 60b in a state that they are isolated from the atmosphere. The transfer mechanism 44 is positioned at the substantially center of the transfer chamber 42. The transfer mechanism 44 includes, for example, multiple transfer arms which are rotatable, extensible, and contractible. In the present example, the transfer mechanism 44 has, for example, two transfer arms 44a and 44b. Provided at front ends of the transfer arms 44a and 44b are holders 45a and 45b, respectively. The wafer W is held by the holder 45a or 45b and transferred between the processing chambers 41a and 41b and the load lock chambers 60a and 60b as described above.

The controller 22 controls the film forming system 30 in the same manner as the apparatus illustrated in FIG. 1, and, thus, explanation thereof is omitted in the present example.

As the processing chamber 41a for performing the metal source adsorption process on the wafer W, it is possible to use, for example, the film forming apparatus 10 illustrated in FIG. 1.

Figure 15:
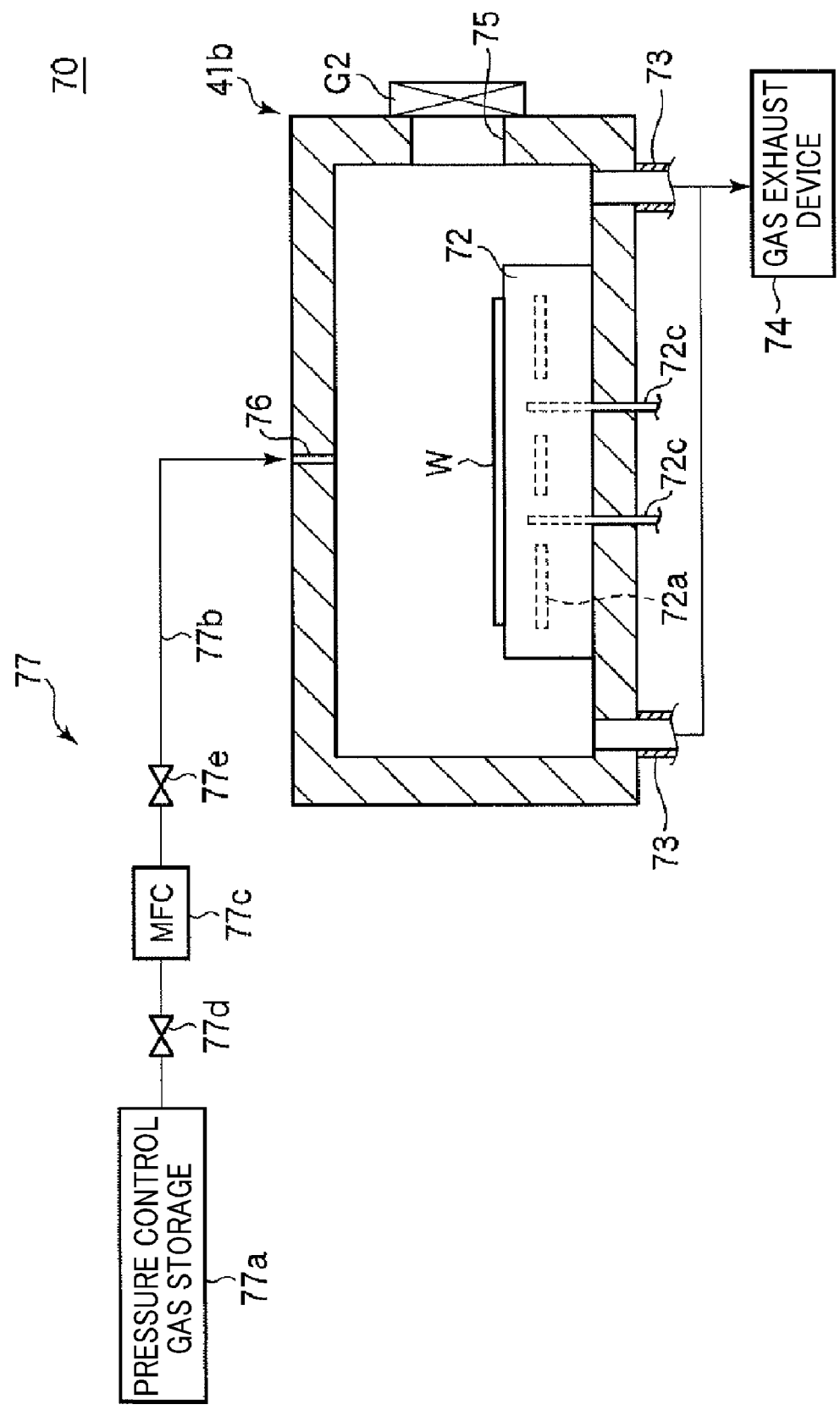
FIG. 15 is a cross-sectional view schematically illustrating an example of a heat treatment apparatus in which the metal oxide film forming method in accordance with the third embodiment of the present disclosure can be performed.

However, as the processing chamber 41b for performing the metal oxide film forming process, the film forming apparatus 10 illustrated in FIG. 1 may be used and a heat treatment apparatus can be also used. FIG. 15 shows an example of a heat treatment apparatus.

FIG. 15 is a cross-sectional view schematically illustrating an example of a heat treatment apparatus in which the metal oxide film forming method in accordance with the third embodiment of the present disclosure can be performed.

As depicted in FIG. 15, a heat treatment apparatus 70 includes the processing chamber (processing vessel) 41b. Provided within the processing chamber 41b is a mounting table 72 that horizontally mounts the wafer W thereon. Embedded in the mounting table 72 is a heater 72a serving as a temperature control unit for the wafer W. Further, provided in the mounting table 72 are three lifter pins 72c (only two of which are illustrated for the simplicity of explanation) which can be vertically moved by a non-illustrated elevating mechanism. The lifter pins 72c vertically move the wafer W, and the wafer W is transferred between a non-illustrated wafer transfer mechanism and the mounting table 72.

A bottom portion of the processing chamber 41b is connected to one end of a gas exhaust pipe 73, and the other end of the gas exhaust pipe 73 is connected to a gas exhaust device 74. Formed through a sidewall of the processing chamber 41b is a transfer port 75 which can be opened and closed by a gate valve G2.

Formed in a ceiling of the processing chamber 41b is a gas discharge hole 76 facing the mounting table 72. The gas discharge hole 76 is connected to a pressure control gas supply line system 77 that introduces, for example, a pressure control gas into the processing chamber 41b.

The pressure control gas supply line system 77 includes, for example, a pressure control gas storage 77a that stores a pressure control gas therein; a supply line 77b that introduces the pressure control gas into the processing chamber 41b; and a mass flow controller (MFC) 77c and valves 77d and 77e that control a flow rate of the pressure control gas flowing in the supply line 77b. The valve 77d is positioned between the pressure control gas storage 77a and the mass flow controller 77c and the valve 77e is positioned between the supply line 77b and the mass flow controller 77c. The pressure control gas may be, for example, an argon (Ar) gas, a hydrogen ($H_2$) gas, and a nitrogen ($N_2$) gas. Further, in order to control a pressure, a pressure gauge is installed at the processing chamber 41b and a pressure control valve is provided at the gas exhaust device 74. However, illustration thereof is omitted herein.

By way of example, in case of using the film forming system 30 illustrated in FIG. 14, the wafer W on which the TEOS film 101 is formed is loaded into the processing chamber 41a and mounted on the mounting table 72 (time t31). Then, in the present example, without increasing the temperature of the wafer W, the metal source gas, e.g., the $(EtCp)_2Mn$ gas in the present example, is supplied into the processing chamber 41a together with a carrier gas, such as an argon (Ar) gas in the present example. Further, an internal pressure of the processing chamber 41a is started to be increased to about 40 Pa at the same time when the supply of the metal source gas is started (time t32) in the present example. If the temperature of the wafer W is not increased, it is not necessary to increase the internal pressure of the processing chamber 41a, but in order to improve supply uniformity of the metal source gas, it may be possible to maintain the internal pressure of the processing chamber 41a at a predetermined level. The supply of the metal source gas and the carrier gas is continued for a predetermined time period. If the predetermined time passes (time t33), the supply of the metal source gas and the carrier gas is stopped. Further, the pressure is reduced in the present example. In this way, the metal source adsorption process is ended.

Subsequently, the wafer W is unloaded from the processing chamber 41a to the transfer chamber 42 (time t34) and loaded into the processing chamber 41b from the transfer chamber 42 (time t35).

Thereafter, the temperature of the wafer W is increased up to a film formation temperature, i.e., about 200° C. in the present example, by the heater 72a (time t36). Further, the carrier gas such as the argon (Ar) gas in the present example, is supplied into the processing chamber 41b as a pressure control gas. Furthermore, the internal pressure of the processing chamber 41b is started to be increased to about 133 Pa at the same time when the supply of the pressure control gas is started in the present example. If the temperature of the wafer W reaches the film formation temperature (time t37), the film formation temperature is maintained constant for a predetermined film formation time. If the film formation time is elapsed (time t38), heating of the wafer W, and a flow rate and a pressure of the pressure control gas are reduced step by step in the present example. If the internal pressure of the processing chamber 41b is reduced to a pressure at which the wafer W can be unloaded, the wafer W is moved out of the mounting table 72 and unloaded from the processing chamber 41b to the transfer chamber 42 (time t39). In this way, the metal oxide film forming process is ended.

In accordance with the metal oxide film forming methods of the second and third embodiments, the metal source is adsorbed onto the surface of the base before the temperature of the wafer W is increased to the film formation temperature or higher. Therefore, it is possible to make the residual moisture on the surface of the base contact with the metal source. For this reason, as in the first embodiment, a thickness of the metal oxide film such as the manganese oxide film 103 in the present example can be controlled.

As a method of controlling a thickness of the metal oxide film, it may be possible to use the method of controlling the thickness of the metal oxide film as explained in the first embodiment. By way of example, the film thickness of the metal oxide film can be controlled based on the amount of the residual moisture 102 on the surface of the base at the time of starting the supply of the metal source gas.

The amount of the residual moisture 102 can be controlled based on the temperature of the base, for example, at the time of starting the supply of the metal source gas. As a method of controlling the temperature of the base, it may be possible to employ the first to third control examples of the base temperature as explained in the first embodiment.

Further, it may be possible to control the amount of the residual moisture 102 based on the other control examples 1 to 3 of the first embodiment.

Fourth Embodiment

In order to control an amount of residual moisture, it may be possible to perform a heat treatment on the wafer W on which a base such as the TEOS film is formed before a metal oxide film is formed. Such a heat treatment is referred to as "pre-annealing process" in the present specification.

(Configuration of an apparatus)

Figure 16:
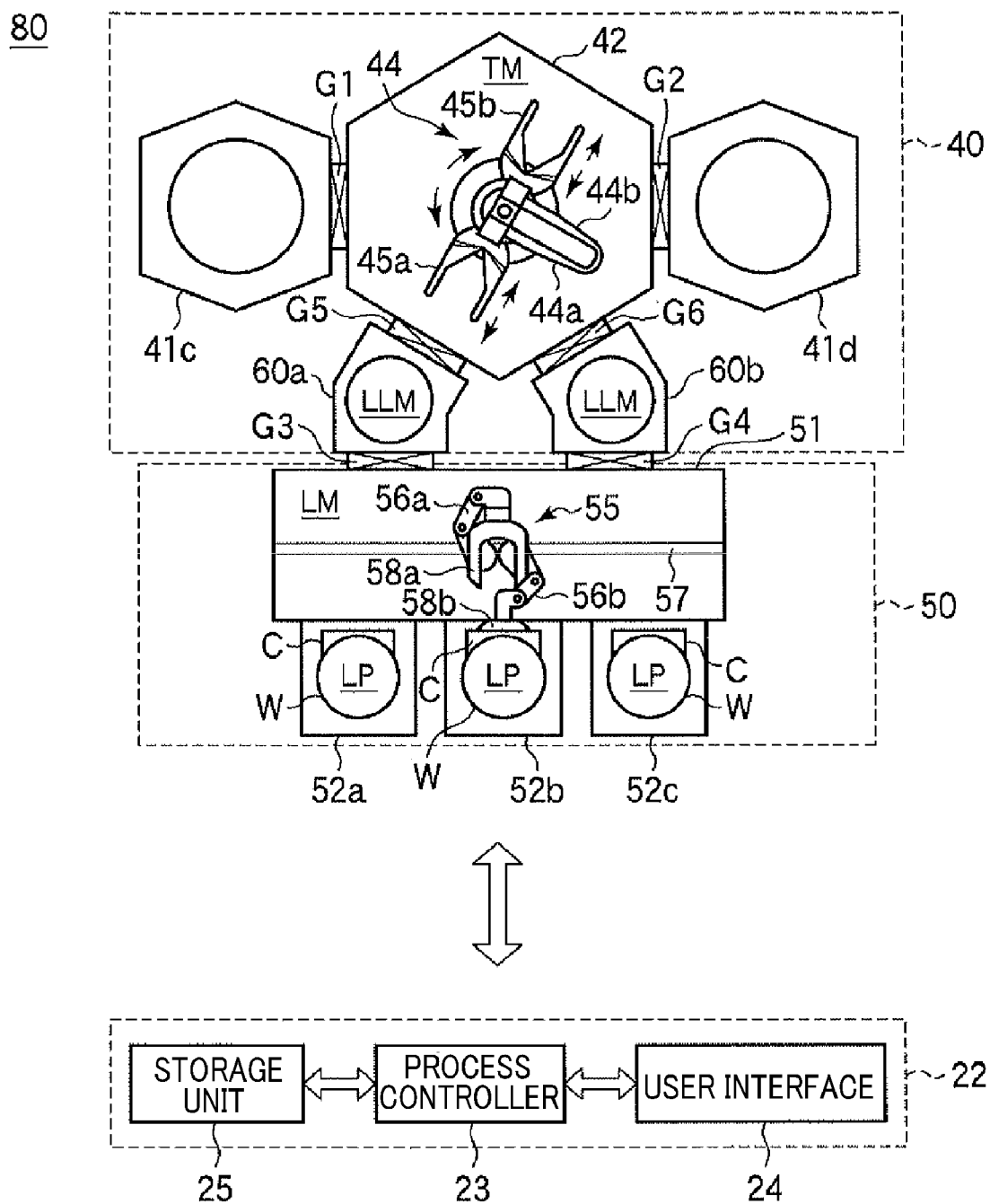
FIG. 16 is a plane view schematically illustrating an example of a film forming system in which a metal oxide film forming method in accordance with a fourth embodiment of the present disclosure can be performed.

FIG. 16 is a plane view schematically illustrating an example of a film forming system in which a metal oxide film forming method in accordance with a fourth embodiment of the present disclosure can be performed. In the present embodiment, there will be explained a film forming system capable of performing a film forming process on a semiconductor wafer (hereinafter, referred to as "wafer") as a substrate in manufacturing a semiconductor device.

As depicted in FIG. 16, a film forming system 80 is a cluster tool type apparatus (multi chamber type apparatus). The film forming system 80 is different from the film forming system 30 illustrated in FIG. 14 in that a processing unit 40 includes a processing chamber 41c that performs a pre-annealing process on a wafer W and a processing chamber 41d that performs a metal oxide film forming process on a base of the wafer W.

The processing chamber 41c may be used as a heat treatment apparatus capable of heating the wafer W. By way of example, it may be possible to use a heat treatment apparatus 90 as illustrated in FIG. 17.

Figure 17:
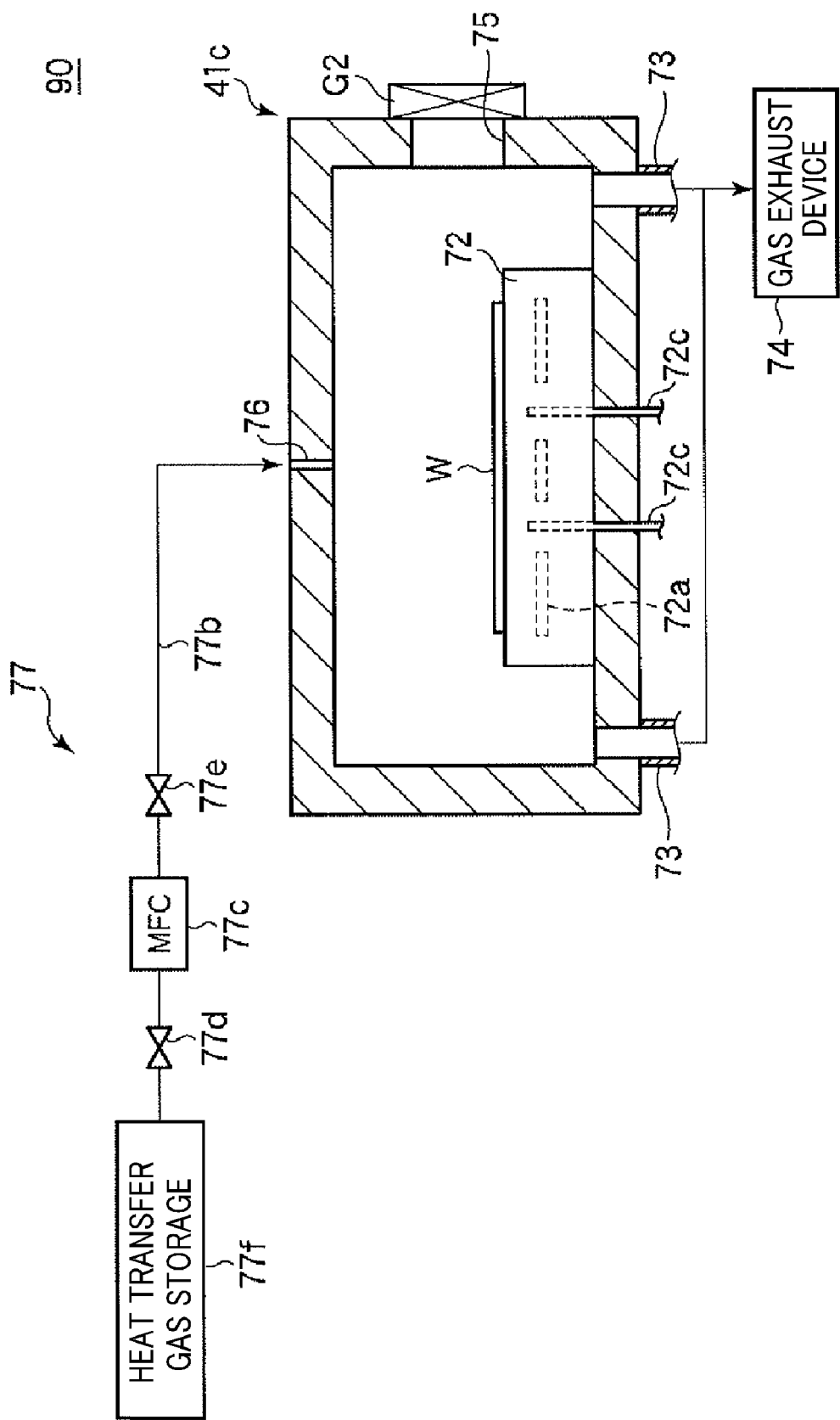
FIG. 17 is a cross-sectional view schematically illustrating an example of a heat treatment apparatus in which the metal oxide film forming method in accordance with the fourth embodiment of the present disclosure can be performed.

As depicted in FIG. 17, the heat treatment apparatus is different from the heat treatment apparatus 70 illustrated in FIG. 15 in that a heat transfer gas storage 77f substitutes for the pressure control gas storage 77a. A heat transfer gas has the same function as the pressure control gas, but in the present example, as the heat transfer gas, a rare gas such as an argon (Ar) gas or a helium (He) gas or an inert gas such as a nitrogen ($N_2$) gas may be used in order to prevent the base from being deteriorated during a pre-annealing process.

The processing chamber 41c is a film forming apparatus, and, by way of example, the thermal CVD apparatus illustrated in FIG. 1 can be used as the processing chamber 41c.

(Metal Oxide Film Forming Method)

Hereinafter, there will be explained an example of a metal oxide film forming method in accordance with the fourth embodiment of the present disclosure.

In the present example, there will be explained an example in which a metal oxide film, such as a manganese oxide film, is formed on a TEOS film formed on a wafer W (for example, a silicon wafer).

Figure 18:
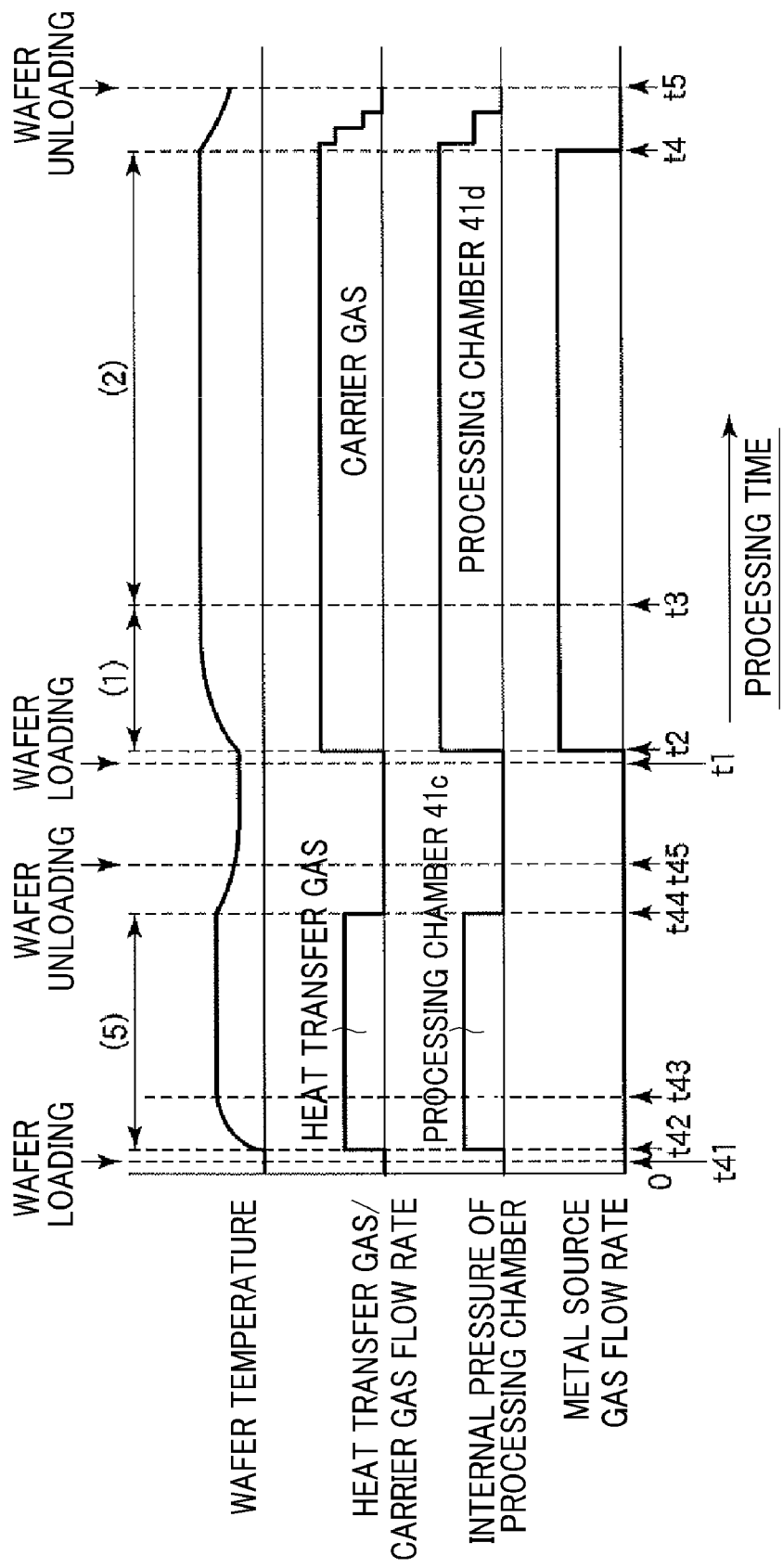
FIG. 18 is a timing chart showing a control example of the metal oxide film forming method in accordance with the fourth embodiment of the present disclosure.

FIG. 18 is a timing chart showing a control example of a wafer temperature, a flow rate of a heat transfer gas/a carrier gas, an internal pressure of a processing chamber, and a flow rate of a metal source gas.

As depicted in FIG. 18, the fourth embodiment is different from the first embodiment in that a process (5) of pre-annealing the base, e.g., the TEOS film in the present example, on the wafer W is performed prior to the metal oxide film forming process explained with reference to FIG. 3.

To be specific, the wafer W on which the TEOS film is formed is loaded into the processing chamber 41c and mounted on the mounting table 72 (time t41). Then, a temperature of the wafer W is increased to a pre-annealing temperature by the heater 72a. The pre-annealing temperature will be described later in detail and it is set to be lower than a film formation temperature. Further, a heat transfer gas is supplied into the processing chamber 41c and an internal pressure of the processing chamber 41c is increased to about 133 Pa at the same time when the temperature rise is started (time t42). If the temperature of the wafer W reaches the pre-annealing temperature (time t43), the pre-annealing temperature is maintained constant for a predetermined pre-annealing time. The pre-annealing time will also be described later in detail and it is set to be shorter than a time period during which all residual moisture on a surface of the TEOS film serving as the base and/or all moisture contained in the TEOS film are not removed. If the pre-annealing time is elapsed (time t44), heating of the wafer W is stopped and, in the present example, a flow rate of the heat transfer gas and an internal pressure of the processing chamber 41c are reduced. If the internal pressure of the processing chamber 41c is reduced to a pressure at which the wafer W can be unloaded, the wafer W is moved out of the mounting table 72 and unloaded from the processing chamber 41c to a transfer chamber 42 (time t45). Subsequently, the pre-annealed wafer W is loaded into the processing chamber 41d from the transfer chamber 42 and mounted on a mounting table. By way of example, if the processing chamber 11 of the thermal CVD apparatus 10 illustrated in FIG. 1 is used as the processing chamber 41d, the wafer W is mounted on the mounting table 12 (time t1). Thereafter, the same process as explained with reference to FIG. 3 is performed.

(Film Forming Mechanism)

A film forming mechanism in accordance with the metal oxide film forming method of the fourth embodiment is illustrated in FIGS. 19A to 19E.

Figure 19:
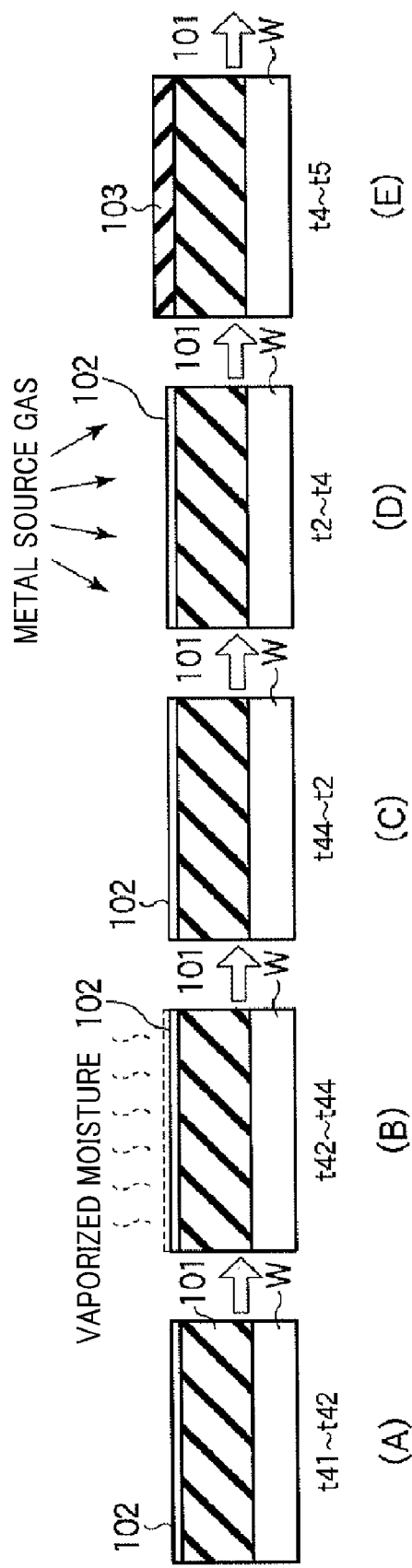
FIGS. 19A to 19E are cross-sectional views showing a film forming mechanism in the metal oxide film forming method in accordance with the fourth embodiment of the present disclosure.

FIG. 19(A) shows a status of the wafer W which has been loaded into the processing chamber 41c.

As depicted in FIG. 19(A), right after the wafer W is loaded into the processing chamber 41c, residual moisture (physical adsorption moisture and/or chemical adsorption moisture) remains on the surface of the TEOS film 101 serving as the base.

In the fourth embodiment, as depicted in FIG. 19(B), the TEOS film 101 is pre-annealed at a temperature lower than the film formation temperature before a metal source gas such as an $(EtCp)_2Mn$ gas is supplied onto the surface of the TEOS film 101, and moisture existing on the surface of the TEOS film 101 and within the TEOS film 101 is vaporized and degassed slowly. By way of example, if the film formation temperature is about 200° C., the pre-annealing temperature is set to be about 170° C. Accordingly, as depicted in FIG. 19(C), an amount of residual moisture 102 on the surface of the TEOS film 101 serving as the base can be controlled. Further, as depicted in FIG. 19(D), the metal source gas such as the $(EtCp)_2Mn$ gas is supplied onto the surface of the TEOS film in which the amount of the residual moisture is controlled even before the temperature of the wafer W reaches the film formation temperature. Subsequently, as depicted in FIG. 19(E), a metal oxide film, such as a manganese oxide film 103 in the present example, having a controlled film thickness is formed on the TEOS film 101.

(Dependency of a Film Thickness on a Temperature Rising Time)

Figure 20:
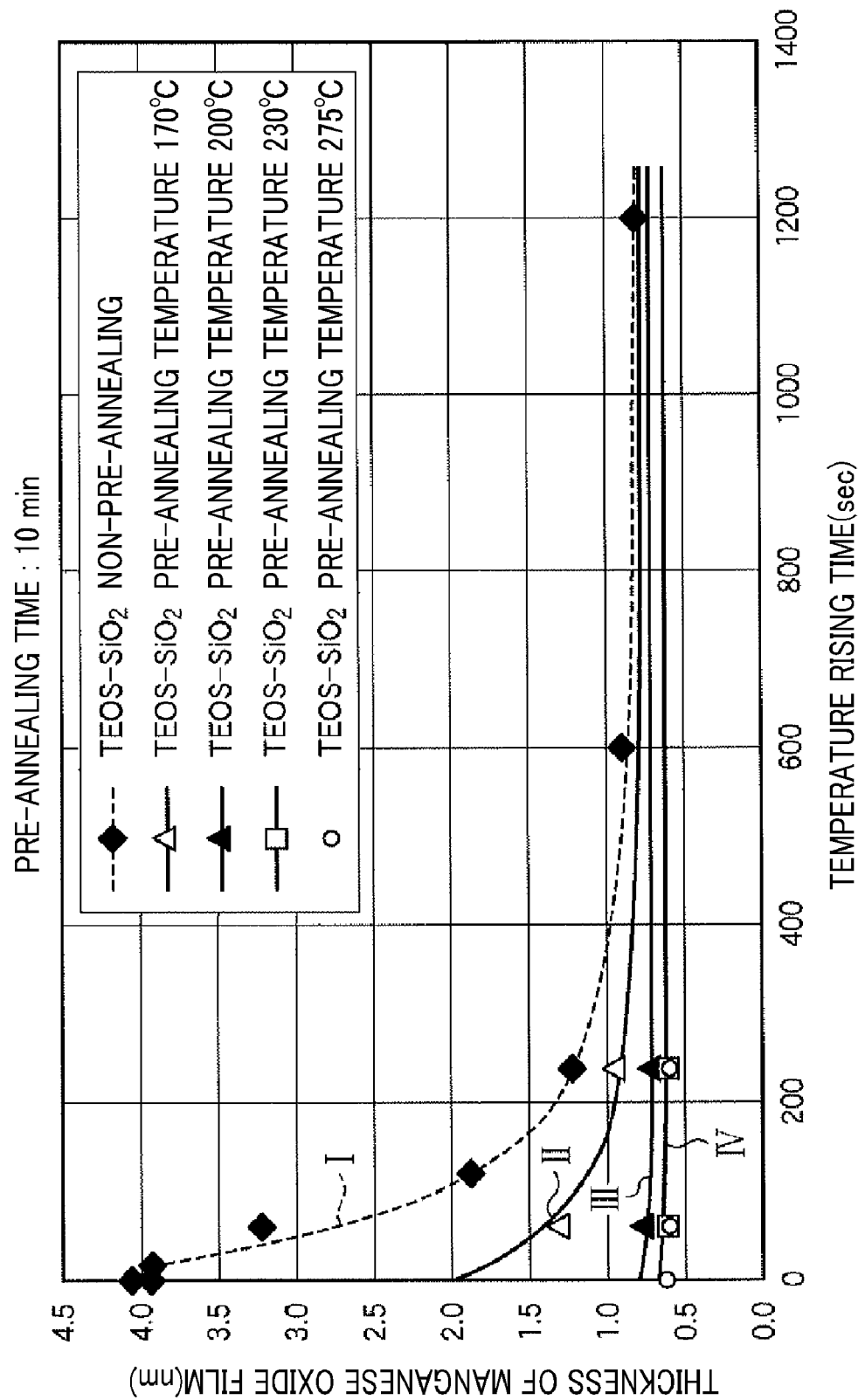
FIG. 20 shows dependency of a thickness of a metal oxide film on a temperature rising time prior to supply of a metal source gas.

FIG. 20 shows dependency of a thickness of a metal oxide film on a temperature rising time prior to supply of a metal source gas.

A line I shown in FIG. 20 indicates the same result as the dependency on the temperature rising time shown in FIG. 8. That is, the line I represents an example in which a pre-annealing process is not performed.

Meanwhile, lines II, III, and IV represent examples in which pre-annealing processes are performed at about 170° C., 200° C., and 230° C., respectively.

To be specific, the line II indicates a result of an example in which the wafer W having thereon the TEOS film 101 is pre-annealed at about 170° C. by the heat treatment apparatus 90 illustrated in FIG. 17 and then the $(EtCp)_2Mn$ gas is supplied thereon about 60 seconds after the temperature rise is started by the thermal CVD apparatus and also, the $(EtCp)_2Mn$ gas is supplied thereon about 240 seconds after the temperature rise is started. Likewise, the line III indicates a result of an example in which the wafer W having thereon the TEOS film 101 is pre-annealed at about 200° C. and then the $(EtCp)_2Mn$ gas is supplied thereon about 60 seconds after the temperature rise is started and also, the $(EtCp)_2Mn$ gas is supplied thereon about 240 seconds after the temperature rise is started. Moreover, the line IV indicates a result of an example in which the wafer W having thereon the TEOS film 101 is pre-annealed at about 230° C. and then the $(EtCp)_2Mn$ gas is supplied thereon about 60 seconds after the temperature rise is started and also, the (EtCp)$_2$Mn gas is supplied thereon about 240 seconds after the temperature rise is started.

Further, FIG. 20 also shows a result of an example in which the wafer W on which the TEOS film 101 is formed is pre-annealed at about 275° C. and then the (EtCp)$_2$Mn gas is supplied thereon at the same time when a temperature rise is started, the (EtCp)$_2$Mn gas is supplied thereon about 60 seconds after a temperature rise is started and also, the (EtCp)$_2$Mn gas is supplied thereon about 240 seconds after the temperature rise is started.

As shown in FIG. 20, the base is pre-annealed before the metal oxide film is formed, and, thus, the dependency of the film thickness on the temperature rising time shown in FIG. 8 can be varied as compared with a case where a pre-annealing process is not performed. Accordingly, by performing a pre-annealing process on a base before a metal oxide film is formed, it is possible to control a thickness of a metal oxide film such as a manganese oxide film.

(Dependency of a Film Thickness on a Pre-Annealing Temperature)

Figure 21:
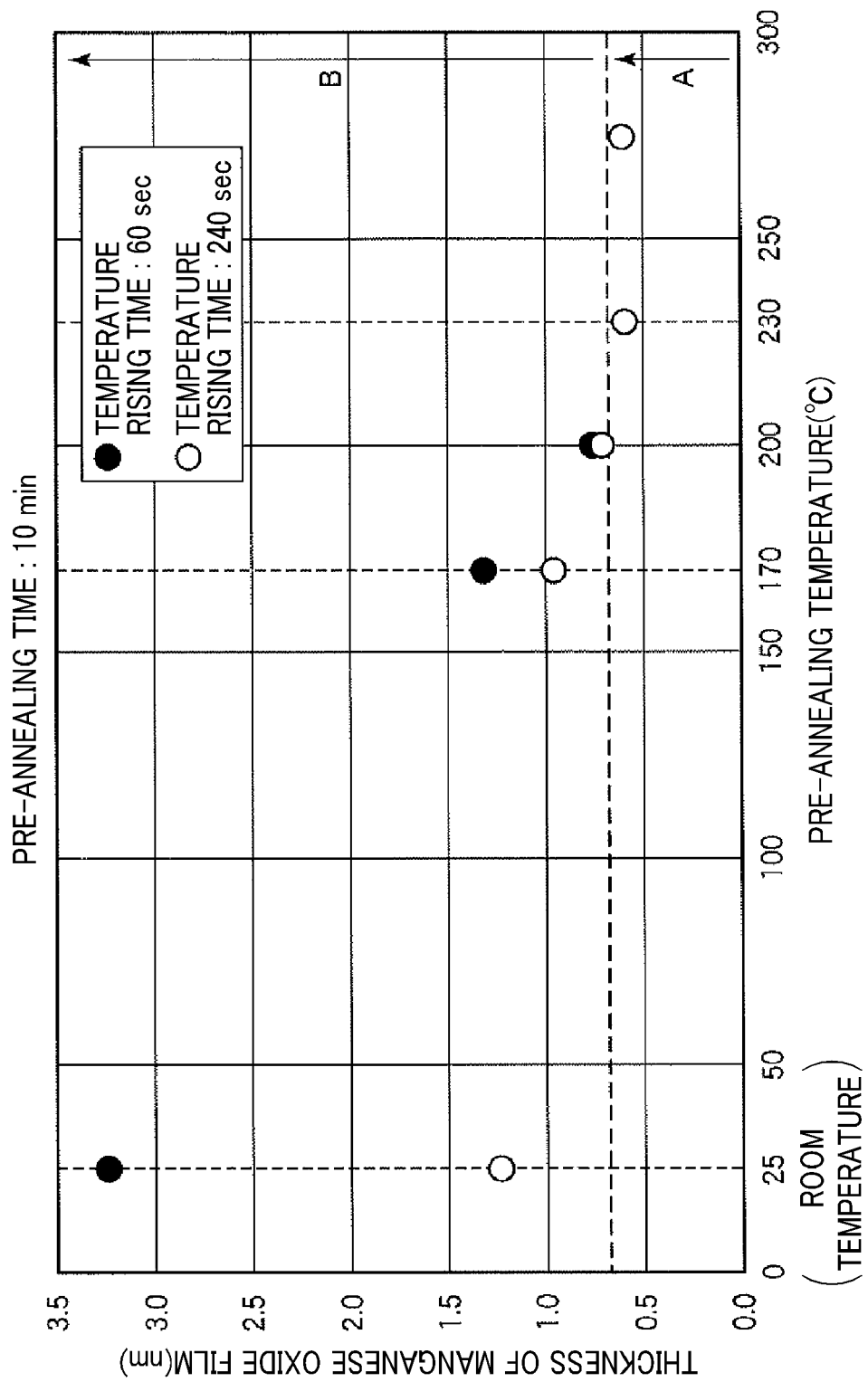
FIG. 21 shows a relationship between a pre-annealing temperature and a thickness of a metal oxide film.

FIG. 21 shows a relationship between a pre-annealing temperature and a thickness of a metal oxide film.

A black dot shown in FIG. 21 indicates a thickness of a manganese oxide film obtained from a case where a wafer W having thereon a TEOS film 101 is pre-annealed and then an (EtCp)$_2$Mn gas is supplied thereon about 60 seconds after a temperature rise is started. Likewise, a white dot indicates a thickness of a manganese oxide film obtained from a case where an (EtCp)$_2$Mn gas is supplied about 240 seconds after a temperature rise is started. A pre-annealing temperatures may be set to be about 170° C., 200° C., 230° C., and about 275° C., and a pre-annealing time may be set to be about 10 minutes for each case.

Further, a black dot and a white dot shown in the left of FIG. 21 indicate a thickness of a manganese oxide film obtained from a case where a pre-annealing temperature is set to be about 25° C. (room temperature), i.e., a pre-annealing process is not performed.

As shown in FIG. 21, if a pre-annealing temperature is increased, a thickness of a manganese oxide film has a tendency to decrease. The film thickness tends to be remarkably decreased when a temperature rising time (a time period from when a temperature rise is started to when an (EtCp)$_2$Mn gas is supplied) is short, while the film thickness tends to be slightly decreased as a temperature rising time becomes longer. Further, if a pre-annealing time is set to be about 10 minutes, the film thickness continues to be decreased until a pre-annealing temperature is lower than about 230° C. If the pre-annealing temperature becomes equal to or higher than about 230° C., the manganese oxide film has an almost uniform film thickness of about 0.6 nm (self-limited film thickness) regardless of the temperature rising time.

(Dependency of a Film Thickness on a Pre-Annealing Time)

Figure 22:
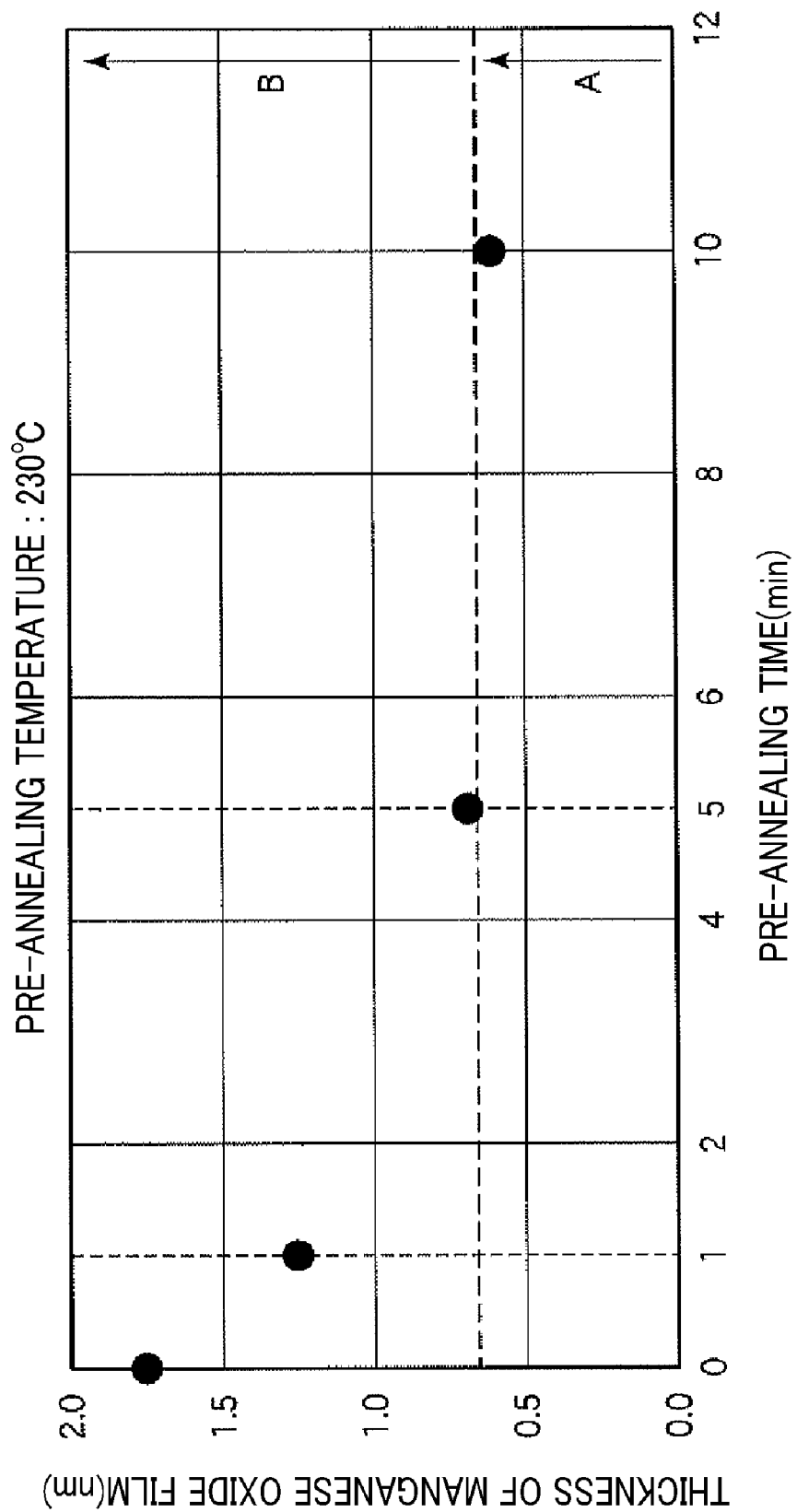
FIG. 22 shows a relationship between a pre-annealing time and a thickness of a metal oxide film.

FIG. 22 shows a relationship between a pre-annealing time and a thickness of a metal oxide film.

A black dot shown in FIG. 22 indicates a thickness of a manganese oxide film obtained from a case where a wafer W on which a TEOS film 101 is formed is pre-annealed and then an (EtCp)$_2$Mn gas is supplied thereon about 240 seconds after a temperature rise is started. A pre-annealing time may be set to be about 1 minute, 5 minutes, and about 10 minutes, and a pre-annealing temperature may be set to be about 230° C. for each case.

Further, a black dot shown in the left end of FIG. 22 indicates a thickness of a manganese oxide film obtained from a case where a pre-annealing time is set to be zero, i.e., a pre-annealing process is not performed.

As shown in FIG. 22, if a pre-annealing time is increased, a thickness of a manganese oxide film has a tendency to decrease. If a pre-annealing temperature is set to be about 230° C. and a temperature rising time is set to be about 240 seconds, the film thickness continues to be decreased until a pre-annealing time takes about 5 minutes. If the pre-annealing time exceeds about 5 minutes, the manganese oxide film has an almost uniform film thickness of about 0.6 nm (self-limited film thickness) regardless of the pre-annealing time.

(Desirable Conditions of a Pre-Annealing Process)

In view of the above-described dependency of the film thickness on the pre-annealing temperature and the dependency of the film thickness on the pre-annealing time, it is deemed that at least one of the surface of the TEOS film 101 serving as the base and the inside thereof may contain an oxygen source α that grows the manganese oxide film 103 depending on the temperature rising time and an oxygen source β that grows the manganese oxide film 103 regardless of the temperature rising time. Since there are two oxygen sources α and β, it is assumed that the manganese oxide film 103 may include, as shown in FIGS. 21 and 22, a manganese oxide film A formed by using only the oxygen source β or mainly using the oxygen source β as an oxidizing agent and a manganese oxide film B formed by using both the oxygen sources α and β as an oxidizing agent.

In view of the above-described assumption, if the base is pre-annealed before the metal oxide film is formed, the pre-annealing process may be ended while the oxygen source α that grows the manganese oxide film depending on the temperature rising time remains in at least one of the surface and the inside of the TEOS film 101 serving as the base. If the oxygen source α does not remain in the surface and the inside of the TEOS film 101, the manganese oxide film 103 formed on the TEOS film 101 may have a self-limited film thickness.

In a pre-annealing process, when a pre-annealing temperature is low, it becomes easy to leave the oxygen source α in the base. Therefore, desirably, the pre-annealing temperature may be set to be lower than the film formation temperature.

Figure 25:
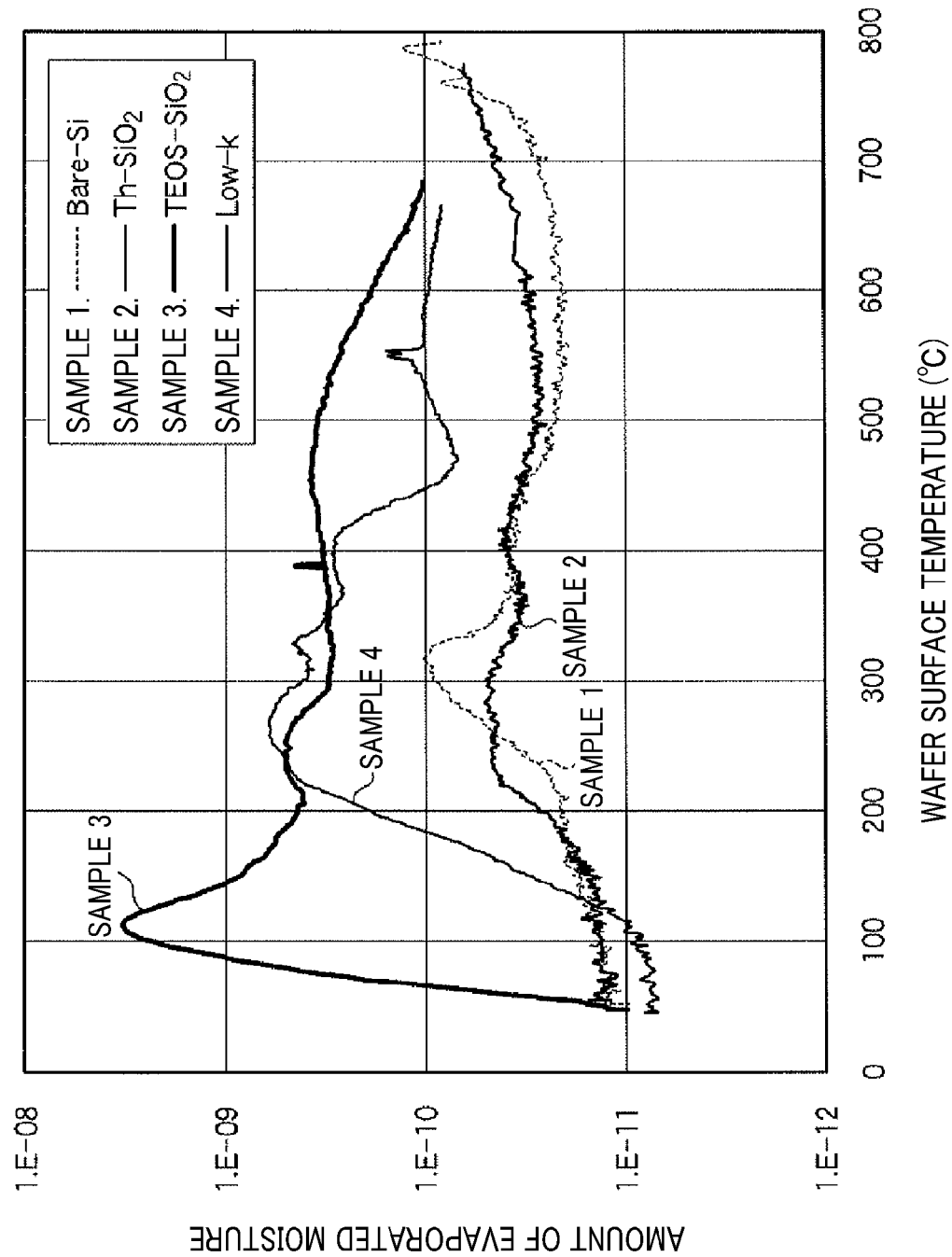
FIG. 25 shows a relationship between a wafer surface temperature and an amount of evaporated moisture.

Referring to FIG. 25 to be explained later, when a surface temperature of the wafer W is about 100° C. and about 250° C., it can be seen that an amount of evaporated moisture reaches a peak, which is considered as being caused by physical adsorption moisture. Further, when a surface temperature of the wafer W is in a range from about 450° C. to about 500° C., it can be seen that an amount of evaporated moisture reaches a peak, which is considered as being caused by chemical adsorption moisture (see Thesis written by N. Hirashita, S. Tokitoh, and H. Uchida for Jpn. J. Appl. Phys. 32, 1993, pp. 1787). In view of the foregoing description, if the oxygen source α is physical adsorption moisture and the oxygen source β is chemical adsorption moisture, it is desirable to set the pre-annealing temperature for leaving the oxygen source α to be equal to or lower than, particularly, 350° C.

Besides, when the pre-annealing time is short, it becomes easy to leave the oxygen source α. Therefore, it is desirable to set the pre-annealing time to be less than a time period during which all residual moisture on a surface of the base and/or all moisture contained within the base is not removed. To be specific, if the pre-annealing temperature is equal to or higher than 200° C., the pre-annealing time may be set to be about 5 minutes or less, and if the pre-annealing temperature is lower than 200° C., the pre-annealing time may be set to be about 10 minutes or less.

By setting the pre-annealing temperature and the pre-annealing time as described above, it is possible to control a film thickness of a metal oxide even if the metal oxide is subject to a self-limited thickness.

First Modification Example of the Fourth Embodiment

Figure 23:
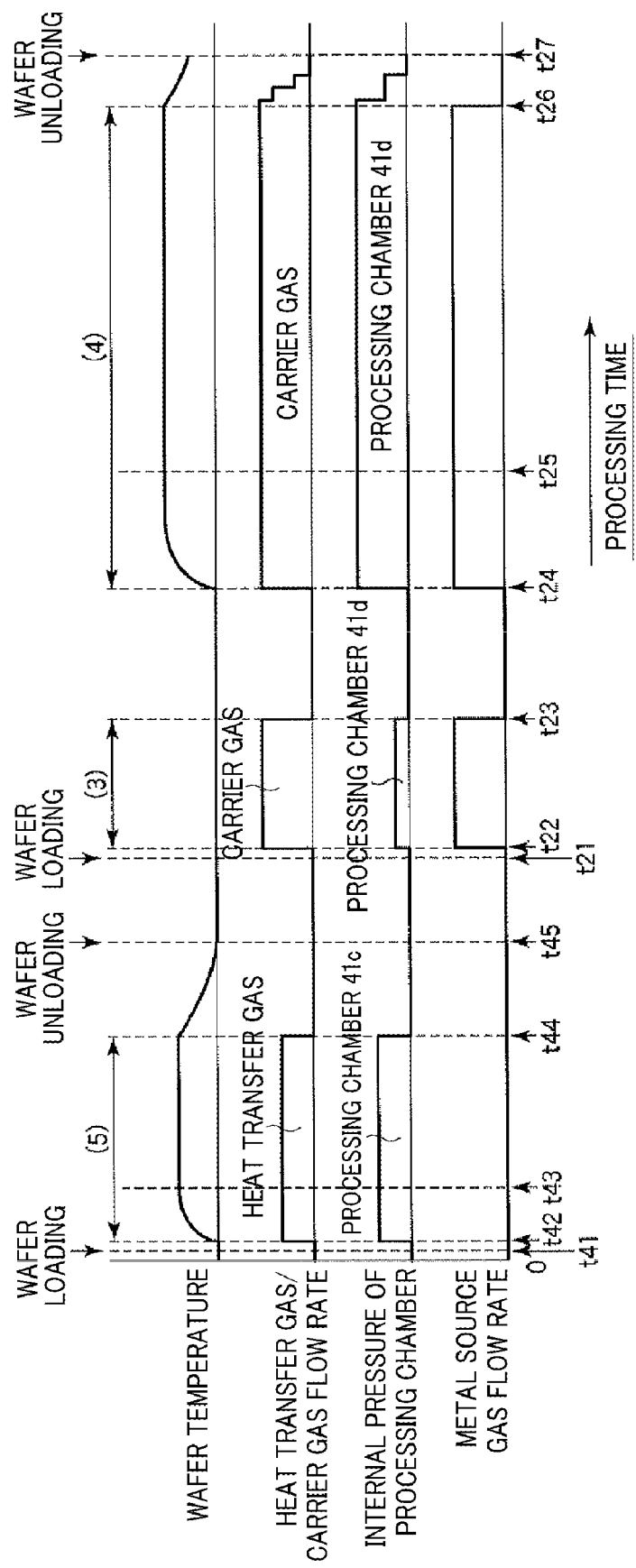
FIG. 23 is a timing chart showing a control example of a metal oxide film forming method in accordance with a first modification example of the fourth embodiment of the present disclosure.

FIG. 23 is a timing chart showing a control example of a metal oxide film forming method in accordance with a first modification example of the fourth embodiment of the present disclosure.

As depicted in FIG. 23, the fourth embodiment can be combined with the second embodiment or the first embodiment.

That is, before the metal source is adsorbed onto the surface of the base, the wafer W on which the base such as the TEOS film 101 is formed may be pre-annealed.

Further, in FIG. 23, the same reference numerals are assigned to the same components as those illustrated in FIGS. 12 and 18, and explanation thereof is omitted.

Second Modification Example of the Fourth Embodiment

Figure 24:
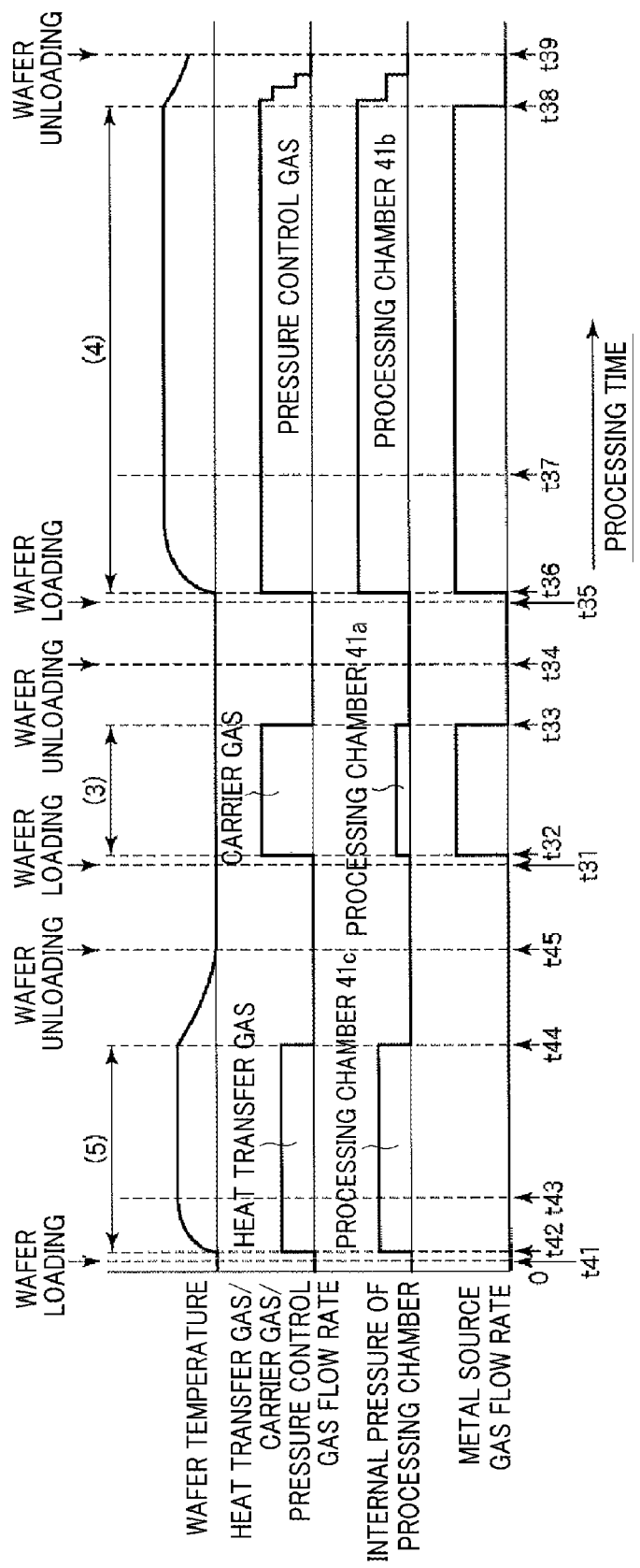
FIG. 24 is a timing chart showing a control example of a metal oxide film forming method in accordance with a second modification example of the fourth embodiment of the present disclosure.

FIG. 24 is a timing chart showing a control example of a metal oxide film forming method in accordance with a second modification example of the fourth embodiment of the present disclosure.

As depicted in FIG. 24, the fourth embodiment can be combined with the third embodiment.

That is, the pre-annealing process (5), the process (3) of making the metal source adsorbed onto the surface of the base, and the metal oxide film forming process (4) can be performed in separate processing chambers. Further, when the processes proceed from the process (5) to the process (3) and then proceed from the process (3) to the process (4), these processes are consecutively performed without exposing the base such as the TEOS film 101 formed on the wafer W to the atmosphere. In this metal oxide film forming method, a semiconductor manufacturing apparatus of a cluster tool type may be used or a film forming system including, for example, the transfer chamber 42 of the film forming system 30 of FIG. 14 and the processing chamber 41c of the film forming system 80 of FIG. 16 connected to the transfer chamber 42 may be used.

In FIG. 24, the same reference numerals are assigned to the same components as those illustrated in FIGS. 13 and 18, and explanation thereof is omitted.

Third Modification Example of the Fourth Embodiment

In the first embodiment, there have been explained the examples of controlling an amount of residual moisture on a base. The control of an amount of residual moisture on a base can be applied to the fourth embodiment, i.e., the pre-annealing process.

By way of example, it is possible to control an amount of residual moisture on a base by supplying a gas containing moisture and/or an —OH group into the processing chamber 41c in which the pre-annealing process is performed and controlling a partial pressure of moisture in the processing chamber 41c or by evaporating most of the residual moisture in the pre-annealing process and making moisture contact with the base while an amount of the moisture is controlled.

Such examples correspond to the examples of controlling the amount of the residual moisture on the base based on the supply of the moisture from the outside.

Fifth Embodiment

A fifth embodiment relates to examples of a base.

In the first to fourth embodiments, a TEOS film has been used as a base. It is desirable to use a film containing moisture therein like a TEOS film as a base. By exposing the moisture contained in the TEOS film on its surface, a metal source gas comes into contact with the moisture exposed on the surface.

FIG. 25 shows a relationship between a wafer surface temperature and an amount of evaporated moisture.

Four samples are shown in FIG. 25.

Sample 1. Silicon wafer W itself (Bare-$SiO_2$)

Sample 2. Silicon thermal oxide film formed by thermally oxidizing a surface of a wafer W (Th-$SiO_2$)

Sample 3. TEOS film formed on a wafer W (TEOS-$SiO_2$: Sample illustrated in FIG. 2)

Sample 4. Silicon oxide-based low-k insulating film formed on a wafer W (k=about 3.0)

These four samples were heated and an amount of evaporated moisture for each sample was observed, and the result thereof is shown in FIG. 25.

As depicted in FIG. 25, the most amount of moisture was evaporated from Sample 3. Particularly, the amount of evaporated moisture reaches a peak when a surface temperature of the wafer W is about 100° C. This proves that the TEOS film contains a lot of moisture on its surface and in the inside thereof.

Further, the amount of moisture evaporated from Sample 4 reaches a peak when a surface temperature of the wafer W is about 250° C., which proves that the low-k film also contains some moisture on its surface and in the inside thereof.

As shown in FIG. 25, any film may be appropriate for the base used in the first to fourth embodiments if the film has a peak of the amount of evaporated moisture when the surface temperature of the wafer W is in a range from about 100° C. to about 250° C.

Further, as a substitute for the film containing moisture, a film containing an —OH group may be used. In particular, as a film containing the —OH group, it is desirable to use a film in which the —OH group is changed into moisture ($H_2O$) through a reaction. It is because by exposing the moisture changed from the —OH group on a surface, it is possible to make a metal source gas contact with the exposed moisture on the surface. Furthermore, it may be possible to use a film containing a lot of —OH groups on its surface as well as in the inside thereof like a hydrophilic surface film which will be described later. It is because it is possible to make a metal source gas contact and react with the —OH group on the surface.

Recently, it has been tried to form multiple pores (holes) in a film (porous low-k film) in order to further reduce a dielectric constant of a low-k insulating film. For example, by forming the pores, a dielectric constant value (k value) can be reduced from about 3.0 to about 2.5. However, since the pores exist in the film, if a barrier film is deposited on the porous low-k film by a CVD method, a precursor for the CVD method passes through the pores and is entered into the porous low-k film, thereby changing a film property such as increase of the k value. For this reason, there has been performed a process called "pore sealing" by which the pores in the surface of the porous low-k film are filled up so as to prevent the precursor or the like from being introduced into the porous low-k film and prevent moisture contained in the porous low-k film from reaching the barrier film through the pores and oxidizing the barrier film or a Cu wiring. The present disclosure can be applied to this pore sealing. If a base including a porous low-k film is heated, moisture comes from the porous low-k film. If the moisture comes into contact with a Mn precursor (for example, $(EtCp)_2Mn$ which easily reacts with moisture) supplied from the outside, they react with each other and MnOx is formed on a surface of the porous low-k film and serves as a pore sealing member. If the MnOx serves as a pore sealing member, the moisture cannot contact with the Mn precursor any longer and a film formation reaction stops (self-limit). To be specific, while a temperature of the wafer W is being increased (i.e., moisture is being continuously evaporated from the surface of the porous low-k film), the Mn precursor may be supplied. However, if the surface of the porous low-k film has a hydrophobic property, the MnOx is not easily deposited as described below. Therefore, it is desirable to make the surface of the porous low-k film have a hydrophilic property in advance. It may be effective not to perform a low-k recovery (LKR) or moderately perform the LKR.

Further, as a base, it is desirable to use a film of which a surface has a hydrophilic property or is treated to have a hydrophilic property and it is desirable use such a film on which moisture is adsorbed. By way of example, if a surface of a base has a hydrophobic property or a water-repellent property, moisture is prevented from staying on the surface, and, thus, a probability of presence of moisture on the surface of the base becomes remarkably lowered, which makes it difficult to consecutively form a metal oxide film. On the contrary, if a surface of a base has a hydrophilic property or is treated to have a hydrophilic property, a high probability of presence of moisture on the surface of the base is maintained, which is advantageous in consecutively forming a metal oxide film.

In addition, as long as a residual substance on a surface of a base reacts with a metal source supplied thereto to form a film, the present disclosure can be applied. The residual substance on the surface of the base may be, for example, formic acid, organic acid such as acetic acid, oxalic acid, and citric acid, or alcohol such as methanol, ethanol, isopropyl alcohol, and silanol. The silanol may include methyl silanol, ethyl silanol, propyl silanol, and butyl silanol. The organic acid, the alcohol, and the silanol are part of a residual substance adhered onto the base during a pre-treatment of the base. Otherwise, after residual moisture is evaporated in a processing chamber in which a pre-annealing process is performed, a small quantity of at least one of the organic acid, the alcohol, the silanol, and water is supplied into the processing chamber under the control of a supply apparatus so as to be adhered onto the base. It may be possible to supply the water or the like into a processing chamber in which a film forming process is performed or a processing chamber in which a pre-annealing process is performed. Desirably, the organic acid, the alcohol, and the silanol may contain an —OH group.

Hereinafter, there will be explained some examples of a hydrophilic treatment for making a base's surface have a hydrophilic property.

First Example

In a first example of a hydrophilic treatment, there is performed a plasma process on a surface of a base. In the plasma process for the hydrophilic treatment, plasma is generated in an atmosphere of a rare gas such as an argon (Ar) gas, an atmosphere containing oxygen such as an oxygen gas $(O_2)$, or an atmosphere of a mixed gas of both gases, and then, a surface of a base is exposed to the plasma to thereby have a hydrophilic property. By way of example, if an end group at the surface of the base is a methyl (—$CH_3$) group, it has a hydrophobic property. Such a base can be seen from, for example, a low-k film such as a SiOC film formed by using an organic material such as trimethylsilane $((CH_3)_3SiH)$. If such a base of which a surface is ended with a —$CH_3$ group is exposed to plasma, the —$CH_3$ group of the surface is cut and the hydrophobic surface of the base is changed to be hydrophilic. Several seconds are enough to perform the plasma process for the hydrophilic treatment. Further, in the plasma process for the hydrophilic treatment, a practical process pressure is in a range from about $10^0$ Pa to about $10^5$ Pa and a practical high frequency power is in a range from about $10^1$ W to about $10^4$ W.

If an oxygen gas is used in a plasma process, a formation of a hydroxyl group (—OH) on the surface of the base accelerates. Therefore, the same moisture as the above-described residual moisture can be newly formed on the surface of the base.

Further, depending on a molecular structure or an element of a base, it is possible to make a surface of the base have a hydrophilic property by generating plasma in an atmosphere containing hydrogen (H), an atmosphere containing carbon (C), an atmosphere containing nitrogen (N), or an atmosphere containing halogen such as fluorine (F).

Second Example

In a second example of a hydrophilic treatment, there is performed an ultraviolet ozone process on a surface of a base. In the ultraviolet ozone process for the hydrophilic treatment, a surface of a base is exposed to an atmosphere containing oxygen such as an ozone gas $(O_3)$ or an oxygen gas $(O_2)$ and an ultraviolet is irradiated to the atmosphere containing oxygen. Accordingly, the ozone and/or the oxygen in the atmosphere containing oxygen become oxygen radicals and these oxygen radicals modify the surface of the base to have a hydrophilic property, and, thus, the surface of the base becomes hydrophilic.

In the ultraviolet ozone process for the hydrophilic treatment, a low pressure mercury lamp (wavelength: from about 185 nm to about 254 nm) or a xenon excimer lamp (wavelength: about 172 nm) may be used as an ultraviolet source. In particular, desirably, as a wavelength of the ultraviolet, a short wavelength of, for example, about 240 nm or less may be used.

Third Example

In a third example of a hydrophilic treatment, there is performed a gas cluster ion beam (GCIB) process on a surface of a base. In the GCIB process for the hydrophilic treatment, a cluster loosely binding several to thousands of atoms or molecules is ionized into positive charges; accelerated by an acceleration voltage in a range from about 2.5 kV to about 80 kV; and irradiated to the surface of the base. A gas used in the GCIB process for the hydrophilic treatment may be, for example, an oxygen gas, a nitrogen gas, a hydrogen gas, a methane gas, or a rare gas such as an argon gas and a helium gas. Otherwise, a mixed gas of these gases may be used. By irradiating a gas cluster ion beam of such a gas onto the surface of the base, the surface of the base can be modified to have a hydrophilic property, and, thus, the surface of the base becomes hydrophilic.

Fourth Example

In a fourth example of a hydrophilic treatment, there is performed a visible light irradiation process on a surface of a base. If the surface of the base contains silicon and is ended with a methyl (—CH) group, a visible light (violet light) having a wavelength of about 425 nm is irradiated onto the surface of the base. Bonding energy of a Si—$CH_3$ bond corresponds to energy having a wavelength of about 425 nm. Therefore, the visible light having a wavelength of about 425 nm is irradiated onto the surface of the base. Accordingly, a —CH group is cut from silicon and is substituted by a hydroxyl group (—OH) or a Si—O—Si bond, and the surface of the base can be modified to have a hydrophilic property, and, thus, the surface of the base becomes hydrophilic.

The present invention has been explained with reference to several embodiments, but it is not limited thereto and can be modified in various ways within a scope not departing from the gist of the present invention.

By way of example, in the above-described embodiments, as a metal organic compound, $(EtCp)_2Mn$ $[=Mn(C_2H_5C_5H_4)_2]$, which is a manganese precursor, containing manganese as metal has been used. However, the metal organic compound is not limited thereto and any other metal organic compound can be used.

For example, any other metal organic compound may include:

$Cp_2Mn$ $[=Mn(C_5H_5)_2]$
$(MeCp)_2Mn$ $[=Mn(CH_3C_5H_4)_2]$
$(Me_5Cp)_2Mn$ $[=Mn((CH_3)_5C_5H_4)_2]$
$(i-PrCp)_2Mn$ $[=Mn(C_3H_7C_5H_4)_2]$
$(t-BuCp)_2Mn$ $[=Mn(C_4H_9C_5H_4)_2]$
$MeCpMn(CO)_3$ $[=(CH_3C_5H_4)Mn(CO)_3]$
$MeMn(CO)_5$ $[=(CH_3)Mn(CO)_5]$
$Mn(DPM)_2$ $[=Mn(C_{11}H_{19}O_2)_2]$
$Mn(DPM)_3$ $[=Mn(C_{11}H_{19}O_2)_3]$
$Mn(DMPD)(EtCp)$ $[=Mn(C_7H_{11}C_2H_5C_5H_4)]$
$Mn(acac)_2$ $[=Mn(C_5H_7O_2)_2]$
$Mn(acac)_3$ $[=Mn(C_5H_7O_2]$
$Mn(hfac)_2$ $[=Mn(C_5HF_6O_2)_3]$
$Mn(iPr-AMD)_2$ $[=Mn(C_3H_7NC(CH_3)NC_3H_7)_2]$
$Mn(tBu-AMD)_2$ $[=Mn(C_4H_9NC(CH_3)NC_4H_9)_2]$.

In particular, it is desirable to use a cyclopentadienyl-based metal organic compound (containing Cp in a chemical formula) of high reactivity with moisture.

Further, in the above-described embodiments, a manganese oxide film has been formed as a metal oxide film, but a film which can be formed by a reaction with, for example, moisture or a hydroxyl group (—OH) may include the following metal oxide films.

$B_2O_3$
$Al_2O_3$
$SiO_2$
$PO_X$
$TiO_2$
$TiSi_XO_Y$
$VO_X$
$CrO_X$
$ZnO$
$GeO_2$
$SnO_2$
$Ta_2O_5$
$MgO$
$CaO$
$Sc_2O_3$
$FeO_X$
$CoO_X$
$NiO$
$CuO$
$Ga_2O_3$
$SrO$
$Y_2O_3$
$ZrO_2$
$Nb_2O_3$
$In_2O_3$
$Sb_2O_5$
$La_2O_3$
$PrO_X$
$Lu_2O_3$
$HfO_2$
$WO_3$
$BiO_X$

Furthermore, in the above-described embodiments, a metal oxide film such as a manganese oxide film has been formed by a thermal CVD method, but manganese oxide film can be formed by an ALD method.

If a metal oxide film such as a manganese oxide film is formed by the ALD method in accordance with the above-described embodiments, a metal source gas such as an $(EtCp)_2Mn$ gas is supplied in a pulse mode onto a surface of a base such as a TEOS film on which residual moisture remains and then a gas containing an oxidizing agent such as steam ($H_2O$) is supplied thereto in a pulse mode. Thereafter, the metal source gas, such as the $(EtCp)_2Mn$ gas, may be supplied again thereto. The gas containing the oxidizing agent may be supplied only once, or if necessary, the metal source gas and the gas containing the oxidizing agent can be alternately supplied multiple times.

In the fourth embodiment, the processing chamber 41c (see FIG. 16) in which a pre-annealing process is performed and the processing chamber 41d (see FIG. 16) in which a source gas of metal oxide is supplied and a metal oxide film forming process is performed have been separated from each other, but the pre-annealing process and the metal oxide film forming process may be performed in a single processing chamber. In this case, since the pre-annealing process and the metal oxide film forming process are performed in a single processing chamber, it is possible to achieve an advantage of reducing a footprint of a film forming system and apparatus cost. Further, as described in the fourth embodiment, if the pre-annealing process and the metal oxide film forming process are performed in separate processing chambers, it can be easy to control a pre-annealing temperature and a film formation temperature. Therefore, it is possible to achieve an advantage of improving controllability of a thickness of a metal oxide film.

Even if a metal oxide film such as a manganese oxide film is formed by the ALD method, since there remains residual moisture on a surface of a base, it is possible to control a film thickness of a first layer of a metal oxide film, e.g., a manganese oxide film in the present example, formed when a metal source gas is first supplied to the surface of the base.

Further, if a metal oxide film is formed by the ALD method, it is possible to achieve an advantage of reducing a film formation time of the metal oxide film by first supplying a metal source gas onto a surface of a base on which residual moisture remains. Since there exists the residual moisture, i.e., an oxidizing agent, on the surface of the base, a first layer of a metal oxide film can be formed before a gas containing an oxidizing agent is supplied.

In addition, the present invention can be modified in various ways within a scope not departing from the gist of the present invention.

EXPLANATION OF REFERENCE NUMERALS

W: Wafer, 101: TEOS film, 102: Residual moisture, 103: Manganese oxide film

What is claimed is:

1. A metal oxide film forming method for forming a metal oxide film on a base, the method comprising:
a process (1) of supplying a metal source gas to a surface of the base before a temperature of the base reaches a film formation temperature of the metal oxide film; and
a process (2) of setting the temperature of the base to be equal to or higher than the film formation temperature and forming the metal oxide film on the base by making a reaction between the metal source gas supplied to the surface of the base and residual moisture containing moisture and/or a hydroxyl group on the surface of the base.

2. The metal oxide film forming method of claim 1, further comprising:
prior to the process (1),
a process of pre-annealing the base at the temperature equal to or lower than the film formation temperature within a time period during which all the residual moisture on the surface of the base and/or all moisture contained within the base are not removed.

3. The metal oxide film forming method of claim 2, wherein the process (1) and the process (2) are continuously performed in a single processing chamber, and the process of pre-annealing the base at the temperature equal to or lower than the film formation temperature within a time period during which all the residual moisture on the surface of the base and/or all moisture contained within the base are not removed is performed prior to the process (1) in another processing chamber separate from the single processing chamber, and the process of pre-annealing the base at the temperature equal to or lower than the film formation temperature within a time period during which all the residual moisture on the surface of the base and/or all moisture contained within the base are not removed and the processes (1) and (2) are consecutively performed without exposing the base to the atmosphere.

4. The metal oxide film forming method of claim 1, wherein while the metal source gas is being supplied to the surface of the base, the moisture contained within the base is supplied to the surface of the base.

5. The metal oxide film forming method of claim 1, wherein the film formation temperature is equal to or higher than a condensation temperature of the metal source gas and lower than a decomposition temperature of the metal source gas.

6. The metal oxide film forming method of claim 5, wherein a film formation time of the metal oxide film is about 10 seconds or less.

7. The metal oxide film forming method of claim 1, wherein a thickness of the metal oxide film is controlled based on an amount of the residual moisture on the surface of the base at the time of starting supply of the metal source gas.

8. The metal oxide film forming method of claim 7, wherein the amount of the residual moisture is controlled based on a temperature of the base at the time of starting the supply of the metal source gas.

9. The metal oxide film forming method of claim 8, wherein the temperature of the base is controlled based on a heating time of the base until the supply of the metal source gas is started.

10. The metal oxide film forming method of claim 8, wherein the temperature of the base is controlled based on ambient pressure of the base until the supply of the metal source gas is started.

11. The metal oxide film forming method of claim 8, wherein the temperature of the base is controlled based on a distance between the base and a heating unit that heats the base.

12. The metal oxide film forming method of claim 8, wherein the temperature of the base is controlled by changing a kind of gas around the base.

13. The metal oxide film forming method of claim 7, wherein the amount of the residual moisture is controlled based on a thickness of the base.

14. The metal oxide film forming method of claim 7, wherein the amount of the residual moisture is controlled based on an exposed area of the base.

15. The metal oxide film forming method of claim 7, wherein the amount of the residual moisture is controlled based on an amount of moisture around the base.

16. The metal oxide film forming method of claim 7, wherein the amount of the residual moisture is controlled by supplying moisture from the outside.

17. The metal oxide film forming method of claim 1, wherein the base is a film containing at least one of moisture and/or a hydroxyl group (—OH).

18. The metal oxide film forming method of claim 1, wherein the base is a film of which a surface has a hydrophilic property or is treated to have a hydrophilic property.

19. The metal oxide film forming method of claim 18, wherein the base is the film of which the surface adsorbs moisture.

20. The metal oxide film forming method of claim 1, wherein the metal source gas contains a metal organic compound.

21. The metal oxide film forming method of claim 20, wherein the metal organic compound is a precursor of cyclopentadienyl-based metal.

22. The metal oxide film forming method of claim 21, wherein the metal is manganese and the metal oxide film is a manganese oxide film.

23. The metal oxide film forming method of claim 1, wherein the process (1) and the process (2) are continuously performed in a single processing chamber.

* * * * *

UNITED STATES PATENT AND TRADEMARK OFFICE
CERTIFICATE OF CORRECTION

PATENT NO. : 8,354,337 B2
APPLICATION NO. : 12/781934
DATED : January 15, 2013
INVENTOR(S) : Kenji Matsumoto et al.

It is certified that error appears in the above-identified patent and that said Letters Patent is hereby corrected as shown below:

In the Specifications:

In column 19, line 13, please add -- 90 -- after the word "apparatus".

In column 27, line 2, please delete "–CH" and insert -- –$CH_3$ --.

In column 27, line 8, please delete "–CH" and insert -- –$CH_3$ --.

In column 27, line 35, please delete "[=$Mn(C_5H_7O_2)$]" and insert -- [=$Mn(C_5H_7)O_2)_3$] --.

Signed and Sealed this
Fourteenth Day of May, 2013

Teresa Stanek Rea
*Acting Director of the United States Patent and Trademark Office*